United States Patent
Sasano et al.

(10) Patent No.: US 9,070,610 B2
(45) Date of Patent: Jun. 30, 2015

(54) SOLID-STATE IMAGING DEVICE AND ELECTRONIC APPARATUS

(75) Inventors: Keiji Sasano, Tokyo (JP); Hiroaki Tanaka, Kanagawa (JP); Hiroki Hagiwara, Kanagawa (JP); Yuki Tsuji, Kanagawa (JP); Tsuyoshi Watanabe, Kanagawa (JP); Koji Tsuchiya, Kanagawa (JP); Kenzo Tanaka, Kagoshima (JP); Takaya Wada, Miyazaki (JP); Hirokazu Yoshida, Kagoshima (JP); Noboru Kawabata, Kagoshima (JP); Hironori Yokoyama, Kagoshima (JP)

(73) Assignee: SONY CORPORATION, Tokyo (JP)

( * ) Notice: Subject to any disclaimer, the term of this patent is extended or adjusted under 35 U.S.C. 154(b) by 721 days.

(21) Appl. No.: 13/162,060

(22) Filed: Jun. 16, 2011

(65) Prior Publication Data

US 2012/0008025 A1    Jan. 12, 2012

(30) Foreign Application Priority Data

Jun. 23, 2010 (JP) ................................ 2010-142778

(51) Int. Cl.
*H04N 5/335* (2011.01)
*H01L 27/146* (2006.01)

(52) U.S. Cl.
CPC . *H01L 27/14618* (2013.01); *H01L 2224/45144* (2013.01); *H01L 2224/48091* (2013.01); *H01L 2224/73265* (2013.01); *H01L 2924/3025* (2013.01)

(58) Field of Classification Search
CPC ... H04N 5/2254; H04N 5/2253; H04N 5/335; H04N 5/378; H04N 3/155; H04N 9/045; H01L 27/14627; H01L 27/14625; H01L 27/14643
USPC .......................... 348/340, 373–375, 294–308
See application file for complete search history.

(56) References Cited

U.S. PATENT DOCUMENTS

| | | | |
|---|---|---|---|
| 7,446,295 B2* | 11/2008 | Chen et al. ................. | 250/208.1 |
| 2005/0099532 A1 | 5/2005 | Tseng | |
| 2006/0017128 A1* | 1/2006 | Harazono ..................... | 257/433 |
| 2007/0235828 A1* | 10/2007 | Yoshihara et al. ............ | 257/432 |

FOREIGN PATENT DOCUMENTS

| | | |
|---|---|---|
| EP | 1653515 | 5/2006 |
| JP | 3417225 | 2/1998 |

OTHER PUBLICATIONS

Partial European Search for EP 11169976.5 dated May 28, 2013.

* cited by examiner

*Primary Examiner* — Tuan Ho
*Assistant Examiner* — Selam Gebriel
(74) *Attorney, Agent, or Firm* — Dentons US LLP

(57) ABSTRACT

A solid-state imaging device includes an image sensor chip and a signal processing chip, which are electrically connected. A low thermal conductivity region is positioned between the image sensor chip and the signal processing chip. The low thermal conductivity region is configured to insulate the image sensor chip from heat, which may be generated by the signal processing chip.

15 Claims, 25 Drawing Sheets

<EMBODIMENT 1>
40

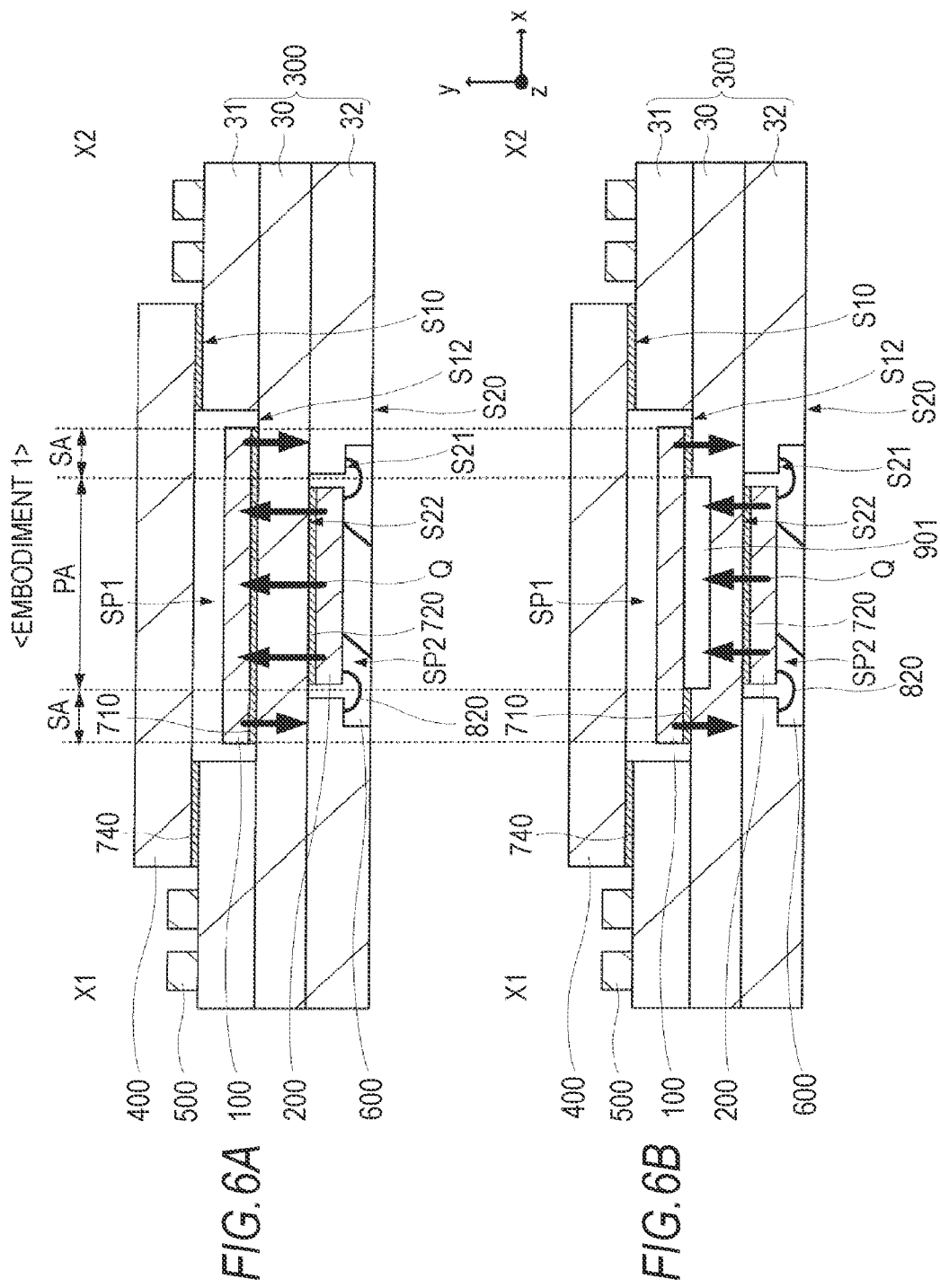

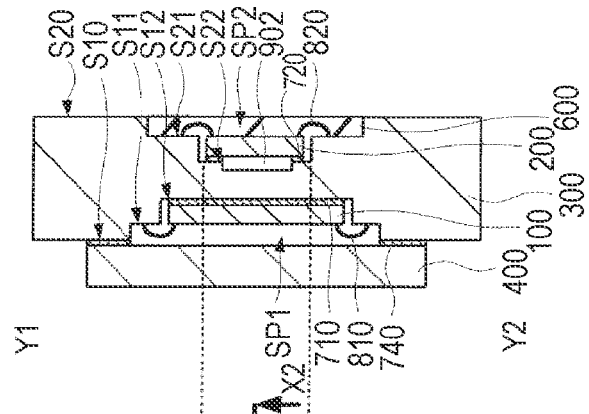
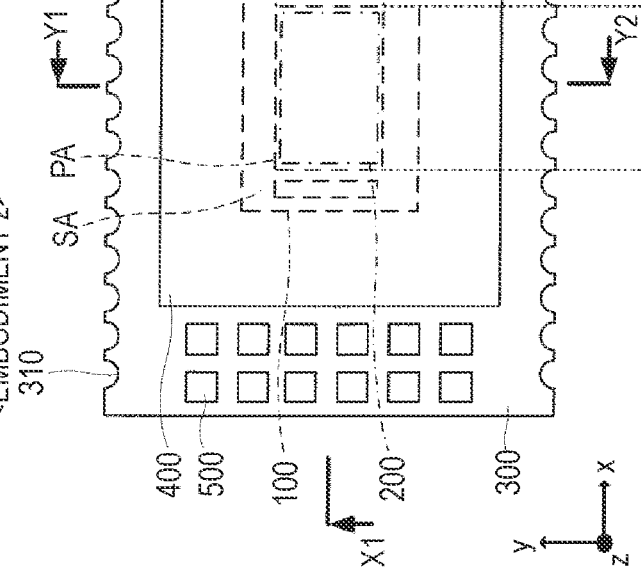
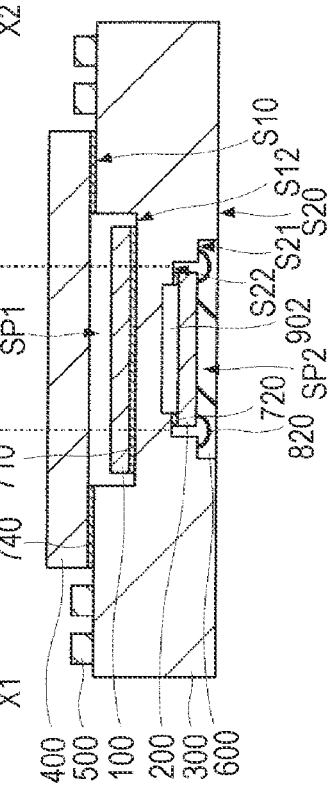

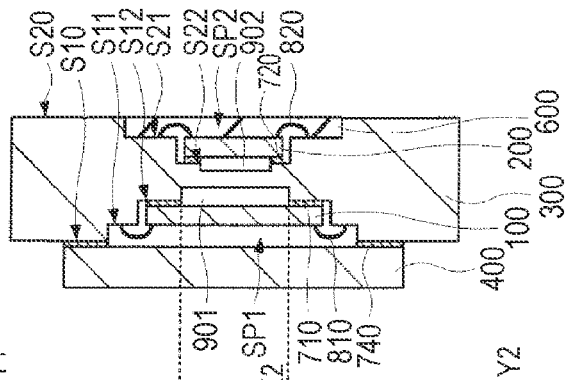
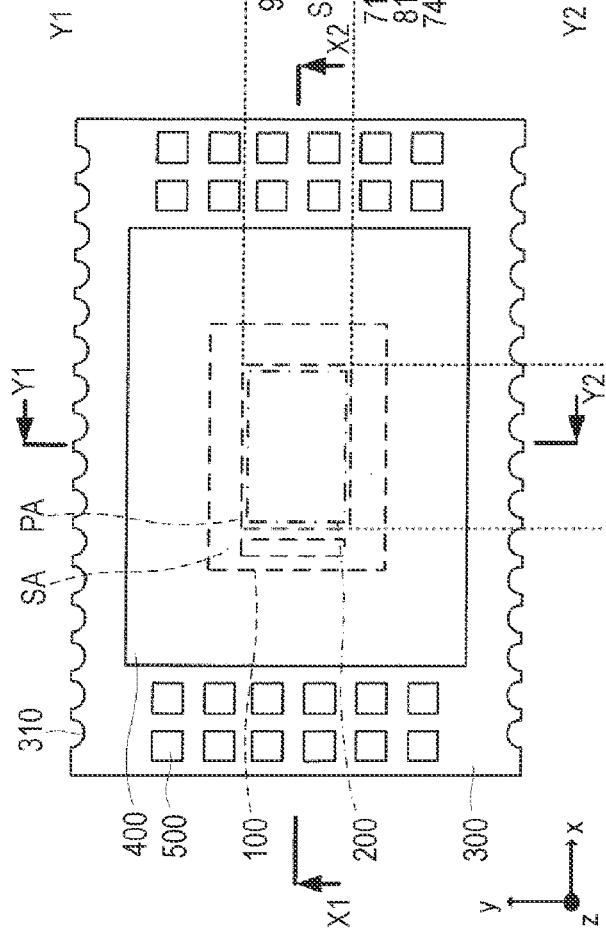

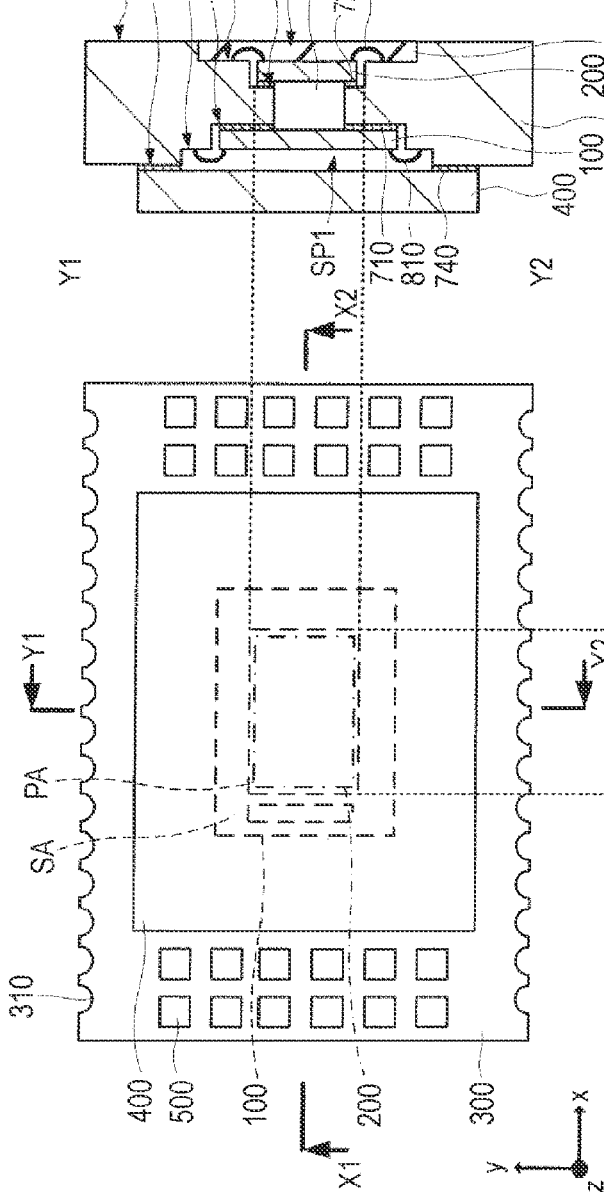

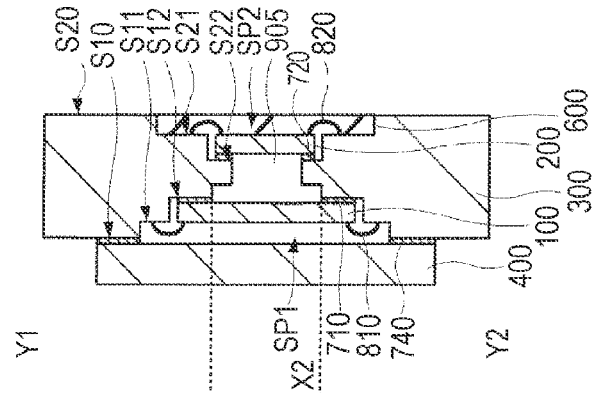
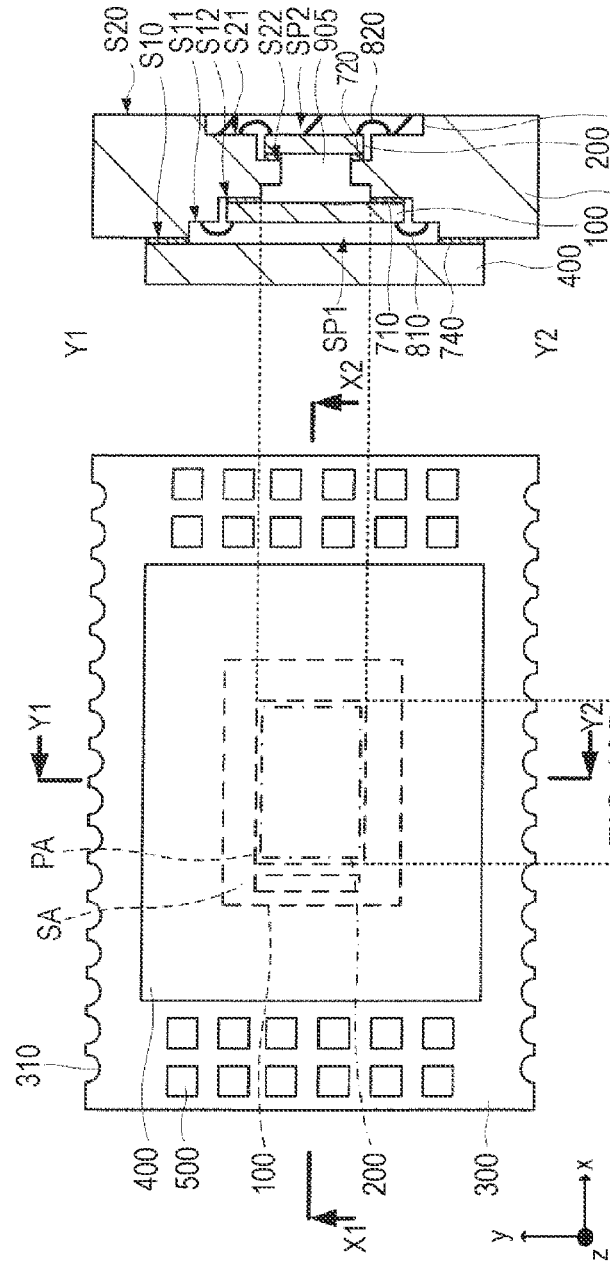
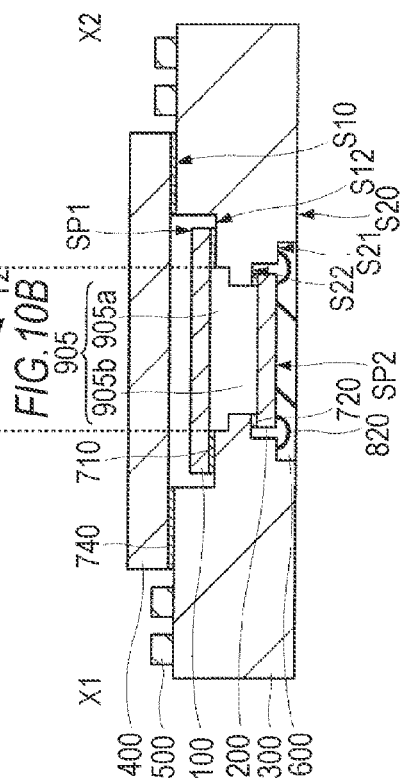

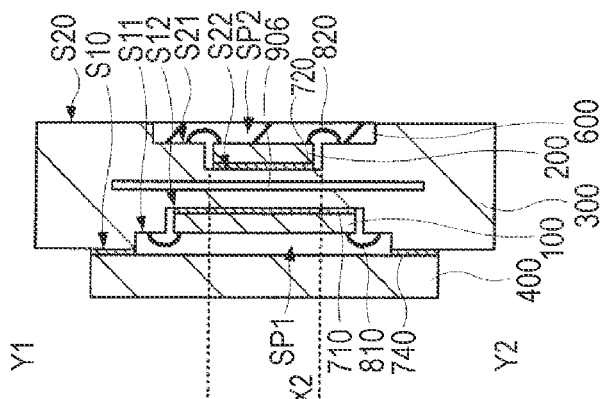
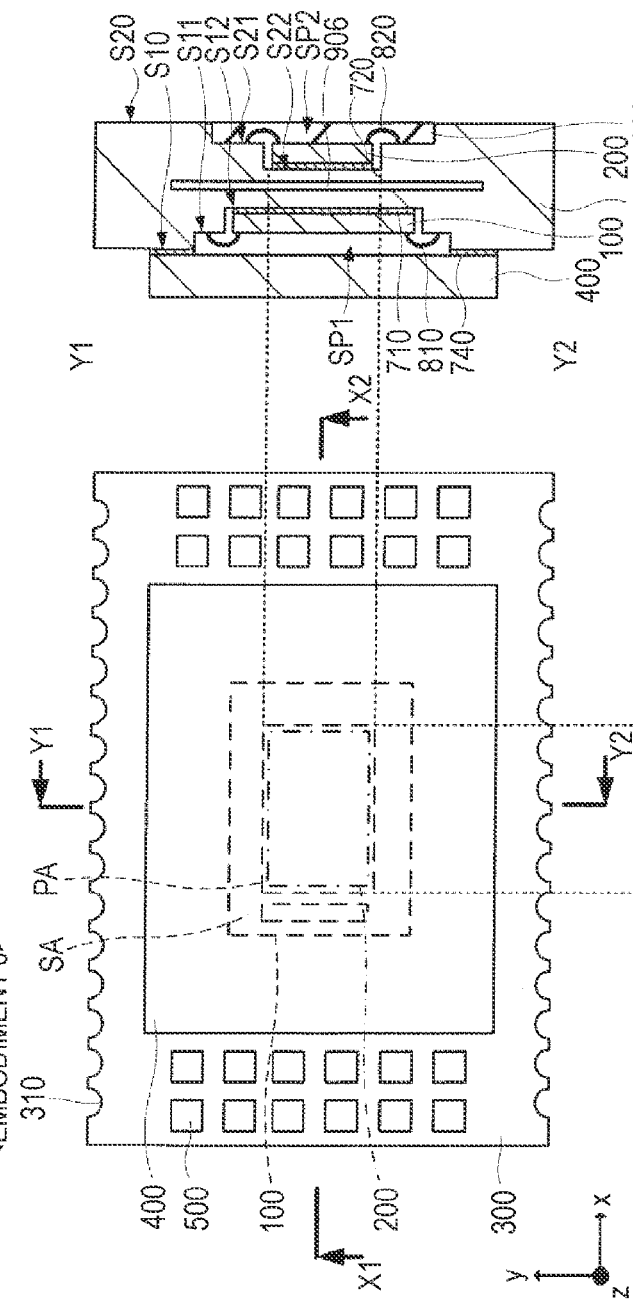
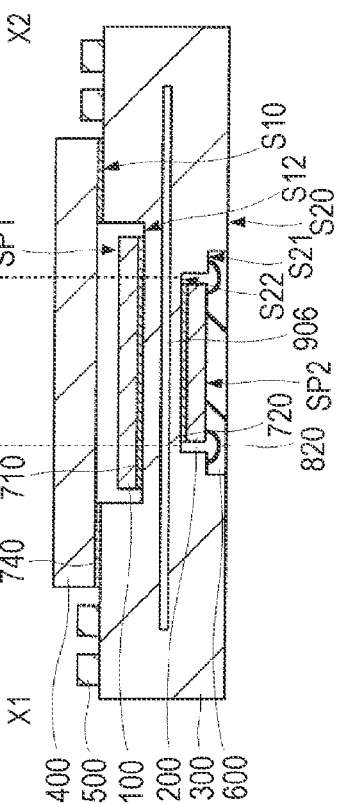

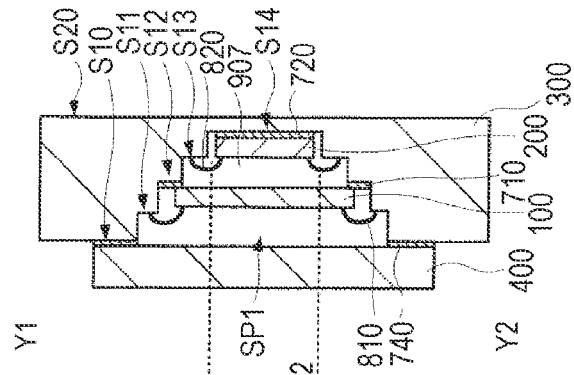
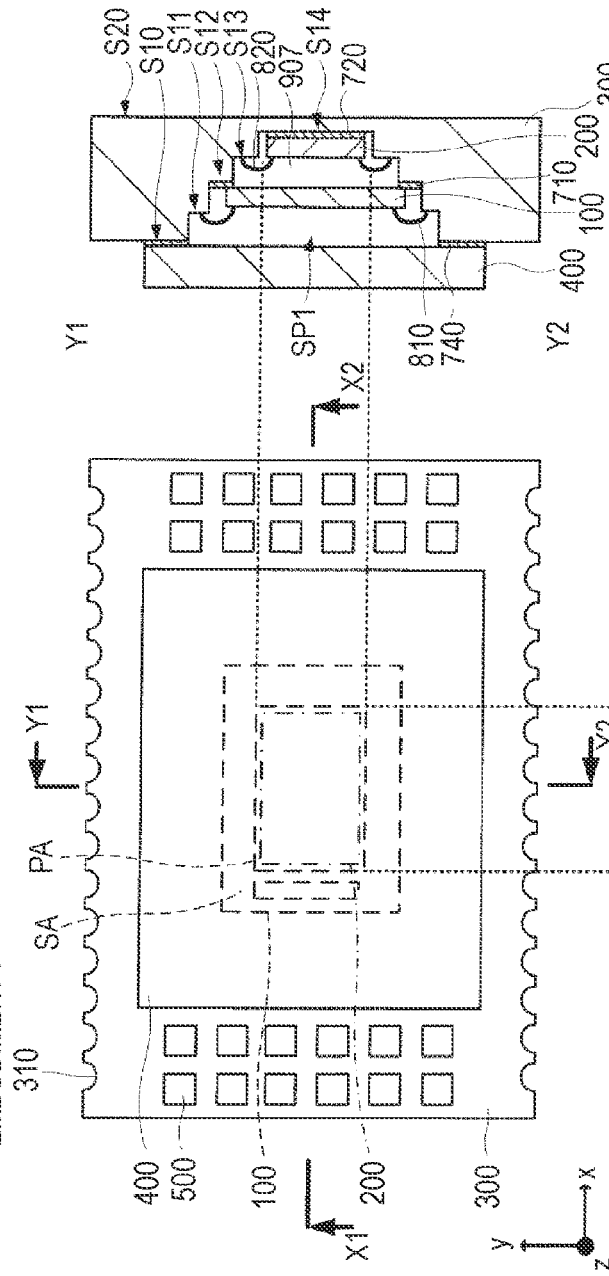
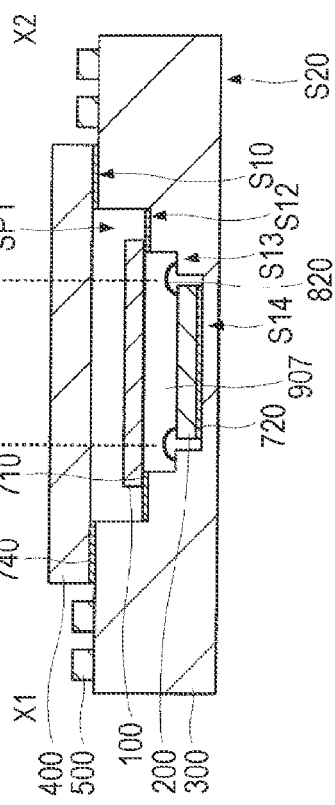

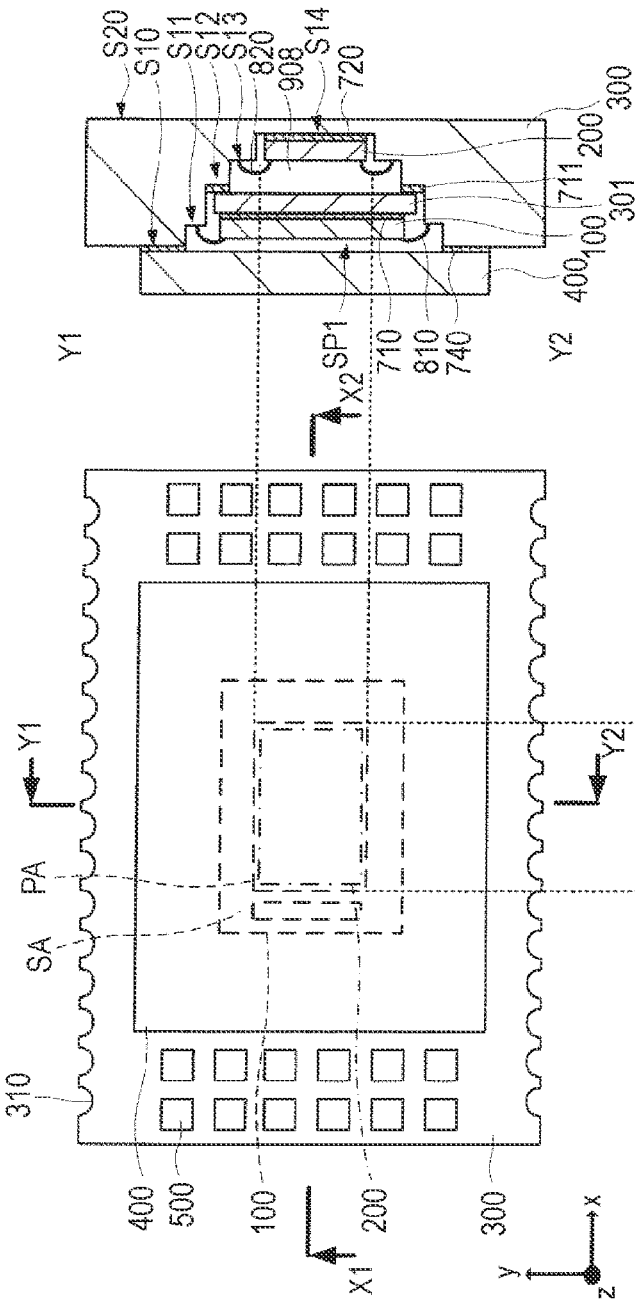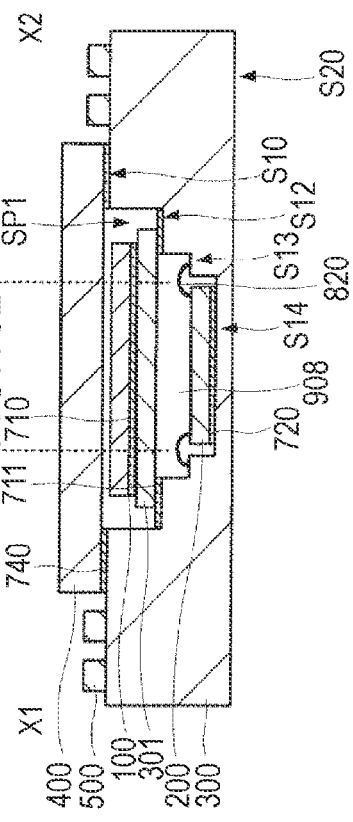

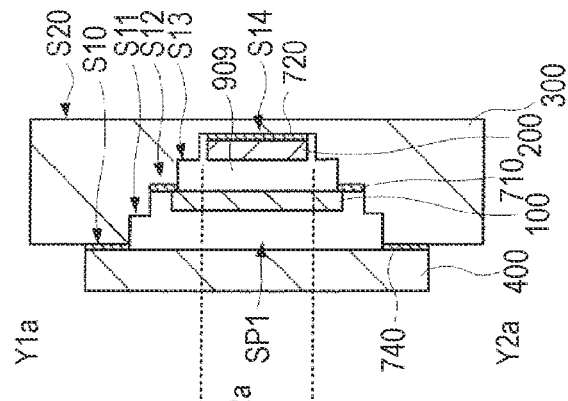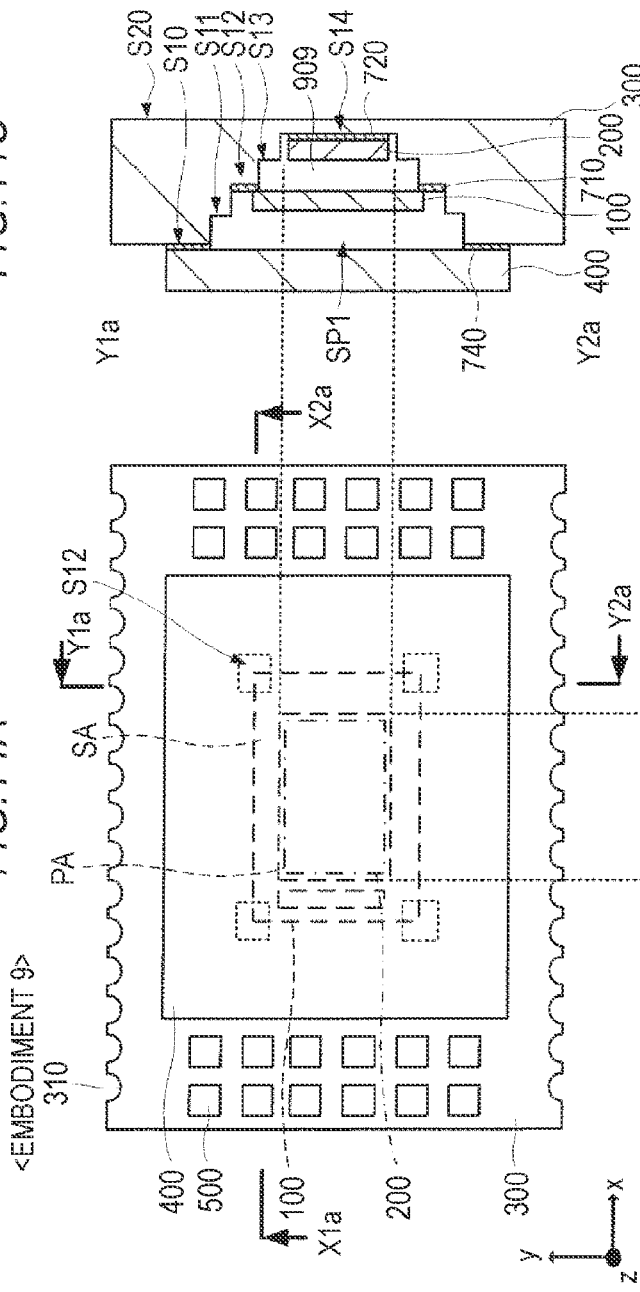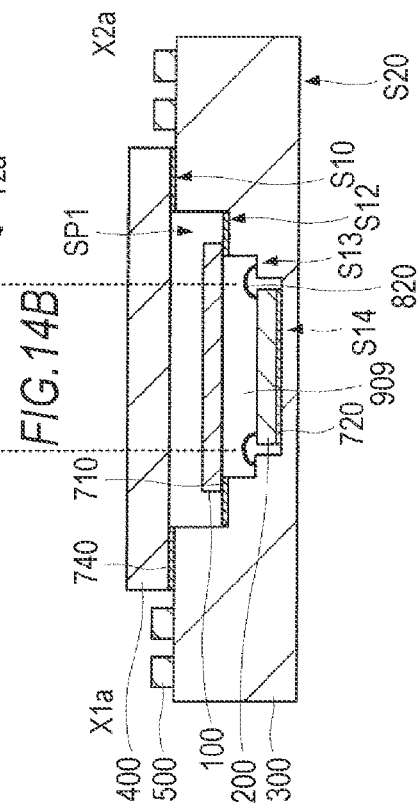

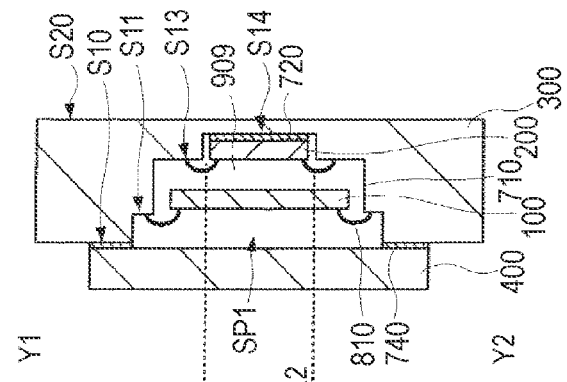
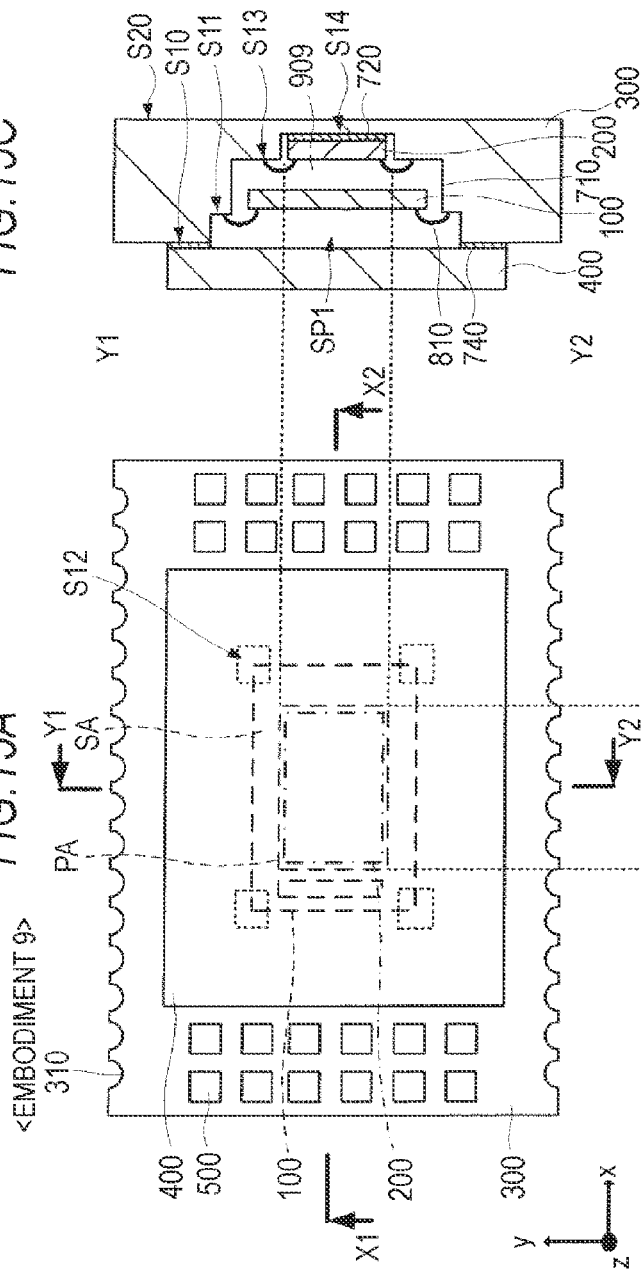
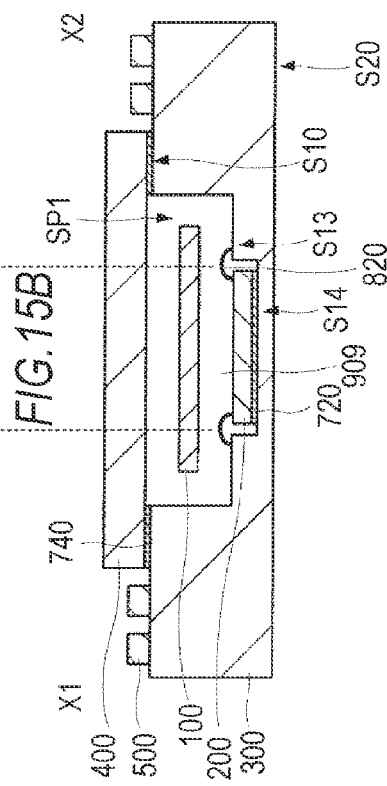

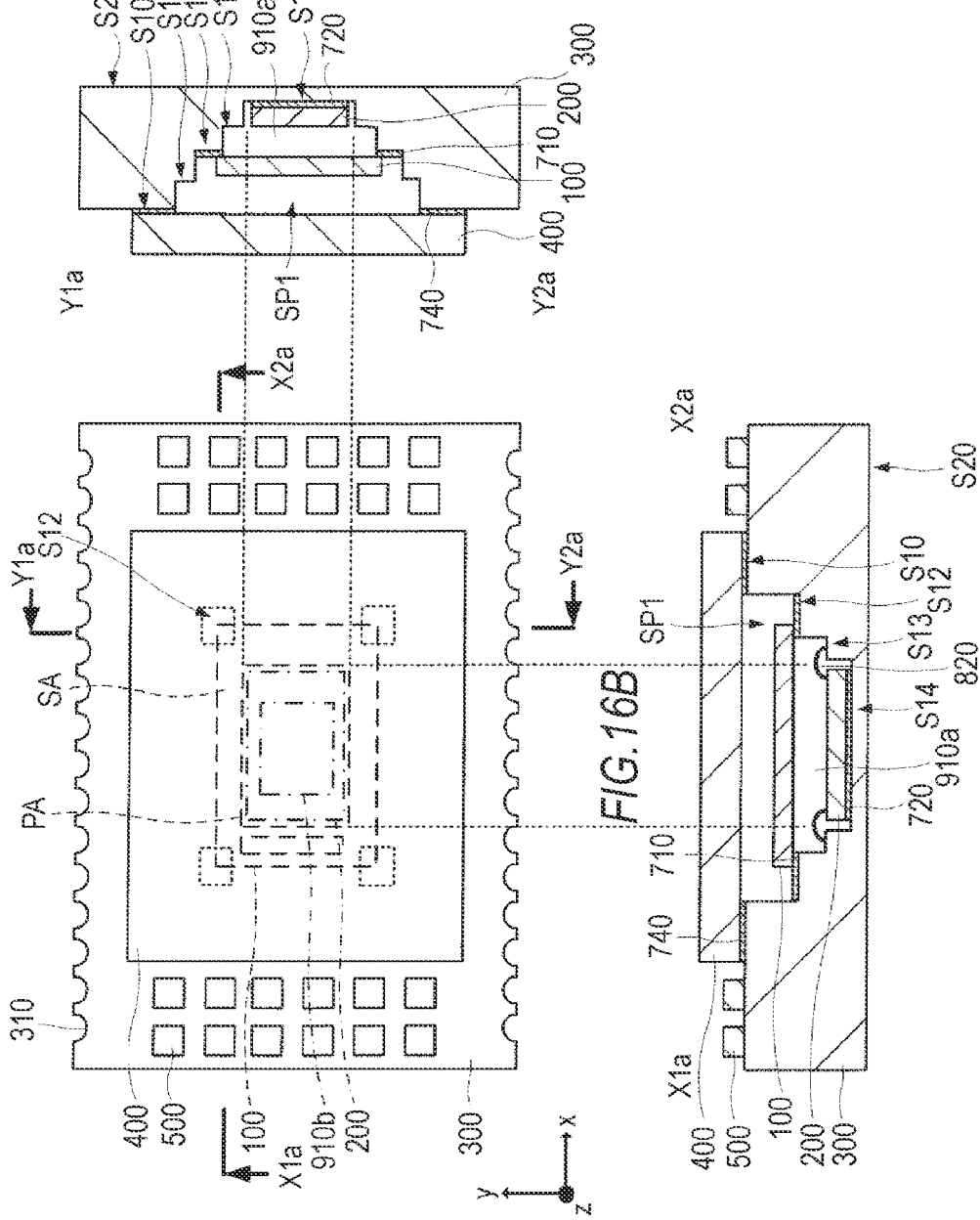

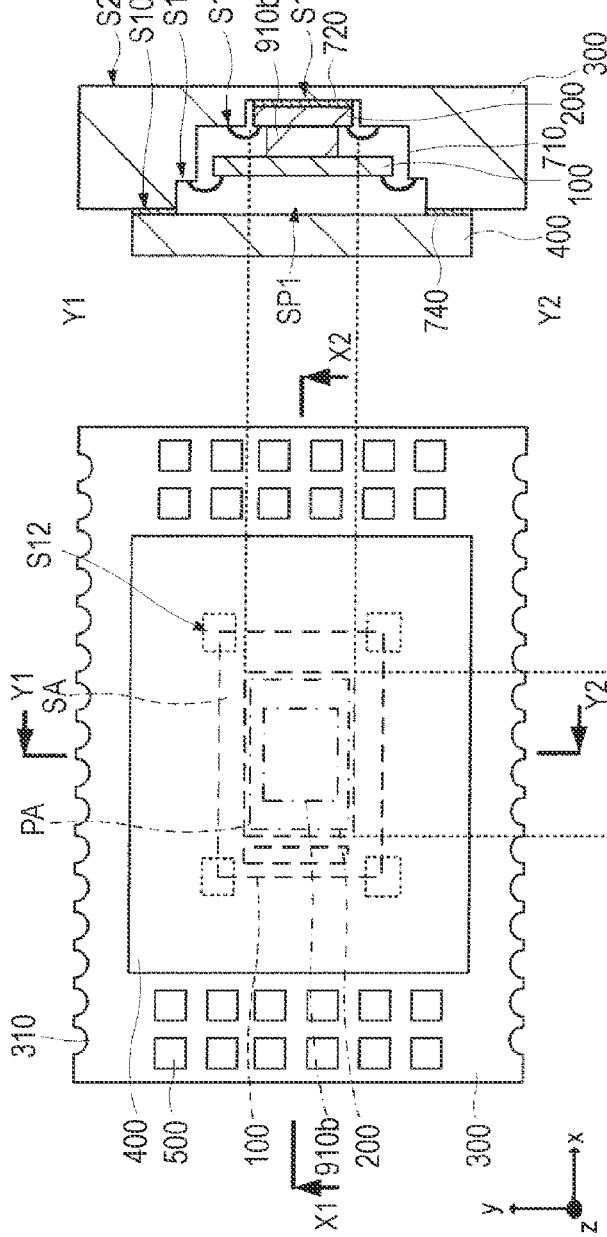

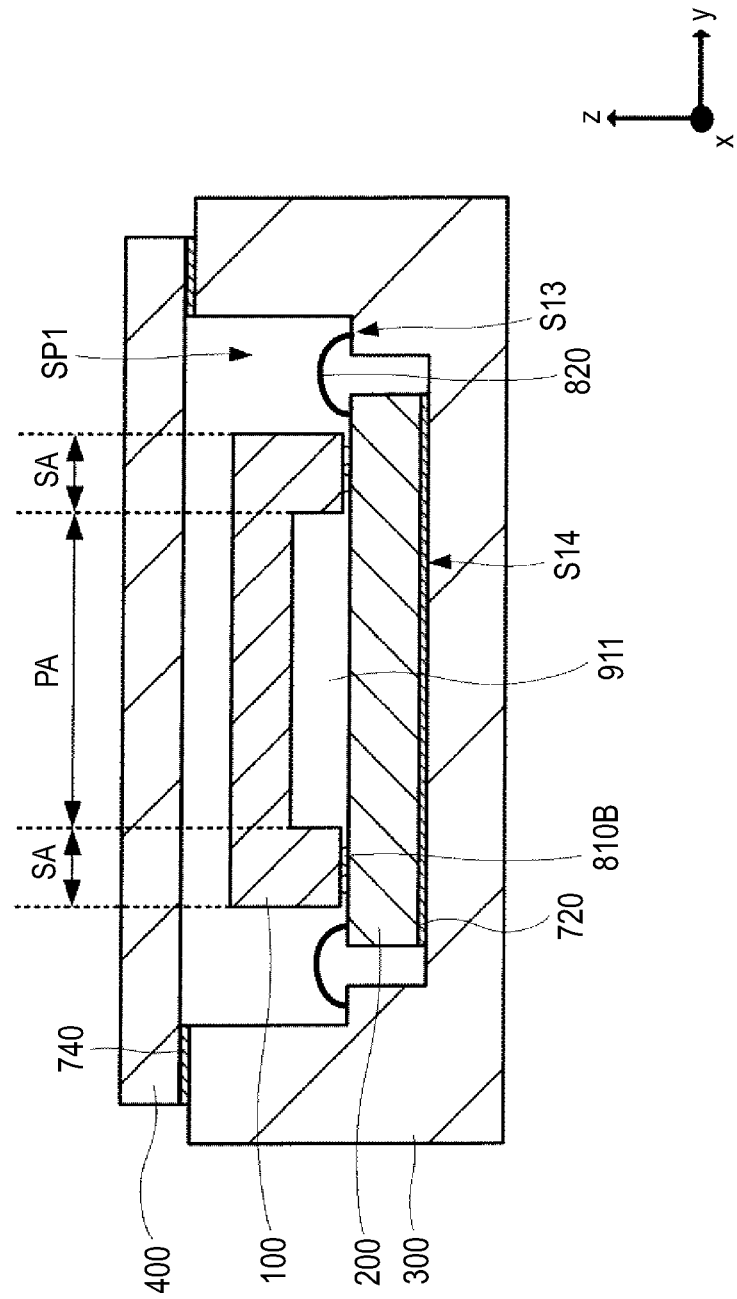

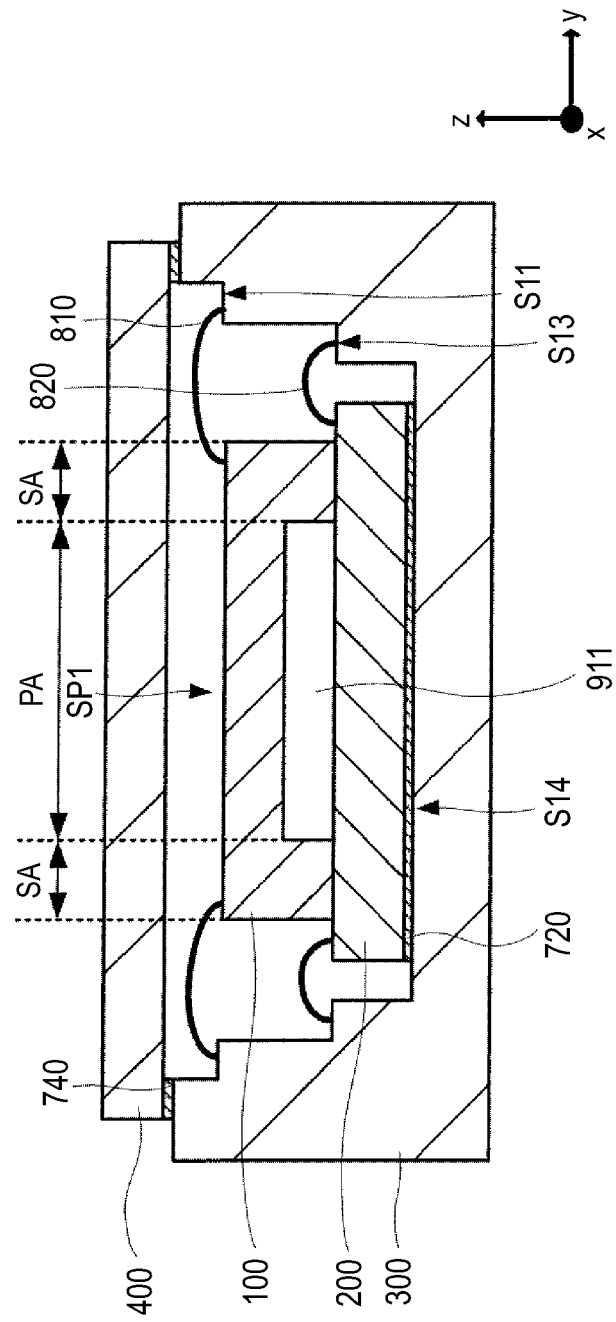

<EMBODIMENT 13>

<EMBODIMENT 15>

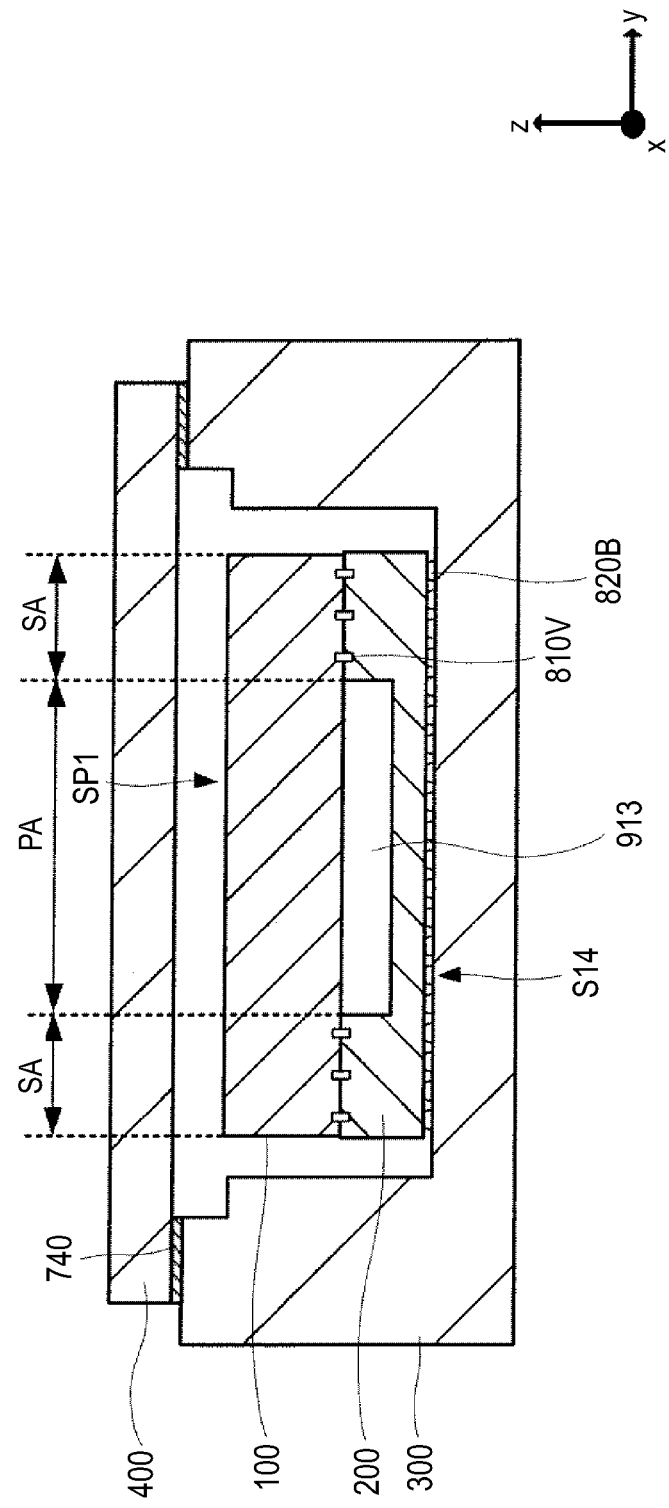

SOLID-STATE IMAGING DEVICE AND ELECTRONIC APPARATUS

RELATED APPLICATION DATA

The present application claims priority to Japanese Patent Application JP 2010-142778, filed in the Japan Patent Office on Jun. 23, 2010, which is incorporated herein by reference in its entirety to the extent permitted by law.

BACKGROUND OF THE INVENTION

The present invention relates to a solid-state imaging device and an electronic apparatus.

An electronic apparatus, such as a digital video camera or a digital still camera, includes a solid-state imaging device. In the solid-state imaging device, an imaging region in which a plurality of pixels are arranged in a matrix includes an image sensor chip on the surface of a semiconductor substrate. For example, the imaging region includes a CCD (Charge Coupled Device) or CMOS (Complementary Metal Oxide Semiconductor) image sensor chip.

In the image sensor chip, a photoelectric conversion section is provided in each of a plurality of pixels. The photoelectric conversion section is, for example, a photodiode, and receives light input through an external optical system in a light receiving surface and carries out photoelectric conversion to generate signal charges.

In the solid-state imaging device, signal processing is performed for an output signal which is output from the image sensor chip.

On the other hand, there is demand for reducing the size of the solid-state imaging device.

For this reason, in the solid-state imaging device, a technique has been proposed in which both the image sensor chip and the signal processing chip which performs signal processing for an output signal are mounted in a single multilayer wiring package (Japanese Patent No. 3417225 (FIG. 1 and the like)).

In addition, for explanatory purposes, the inventors of the present invention have included the following discussion to explain issues that they have recognized and have overcome with the present invention. In this regard, FIGS. 24A to 24C are diagrams schematically showing a solid-state imaging device.

FIG. 24A shows an upper surface. FIG. 24B shows a cross-section taken along the line X1-X2 of FIG. 24A. FIG. 24C shows a cross-section taken along the line Y1-Y2 of FIG. 24A.

As shown in FIGS. 24A to 24C, the solid-state imaging device includes an image sensor chip 100, a signal processing chip 200, and a multilayer wiring ceramic package 300Z.

The image sensor chip 100 is, for example, a CCD. As shown in FIG. 24A, the image sensor chip 100 carries out imaging in an imaging region PA. In the imaging region PA, a plurality of pixels (not shown) are arranged in a matrix, and receive incident light as a subject image and generate signal charges. In the image sensor chip 100, an output circuit is provided in a peripheral region SA around the imaging region PA, and outputs the signal charges transferred from the imaging region PA as an output signal.

The signal processing chip 200 is, for example, an analog front end (AFE) or an analog-to-digital converter (ADC), and performs signal processing for an output signal from the image sensor chip 100.

As shown in FIGS. 24A to 24C, in the multilayer wiring ceramic package 300Z, both the image sensor chip 100 and the signal processing chip 200 are mounted.

Specifically, as shown in FIGS. 24B and 24C, the image sensor chip 100 is provided on the upper surface of the multilayer wiring ceramic package 300Z. An accommodating space SP1 which is depressed in a concave shape is provided in the upper surface of the multilayer wiring ceramic package 300Z, and the image sensor chip 100 is accommodated in the accommodating space SP1. The image sensor chip 100 is mounted with a die bond material 710 on a bottom surface S12 of the accommodating space SP1. Surface S12 may serve as a die attachment surface. As shown in FIG. 24B, a step is provided in the accommodating space SP1, and wires 810 are provided between a surface S11 of the step and the surface of the image sensor chip 100 provided on the bottom surface S12 to electrically connect the surface S11 of the step and the surface of the image sensor chip 100.

As shown in FIGS. 24B and 24C, a glass plate 400 is bonded to the upper surface of the multilayer wiring ceramic package 300Z by a seal material 740 so as to seal the accommodating space SP1. Discrete components 500 are provided around the glass plate 400 on the upper surface of the multilayer wiring ceramic package 300Z.

On the other hand, as shown in FIGS. 24B and 24C, the signal processing chip 200 is mounted on the lower surface of the multilayer wiring ceramic package 300Z. An accommodating space SP2 which is depressed in a concave shape is provided in the lower surface of the multilayer wiring ceramic package 300Z, and the signal processing chip 200 is accommodated in the accommodating space SP2. The signal processing chip 200 is mounted with a die bond material 720 on a bottom surface S22 of the accommodating space SP2. Surface S22 may serve as a die attachment surface. As shown in FIGS. 24B and 24C, a step is provided in the accommodating space SP2, and wires 820 are provided between a surface S21 of the step and the surface of the signal processing chip 200 provided on the bottom surface S22 to electrically connect the surface S21 of the step and the surface of the signal processing chip 200.

As shown in FIGS. 24B and 24C, a filled layer 600 is provided in the lower surface of the multilayer wiring ceramic package 300Z so as to fill the accommodating space SP2.

As shown in FIG. 24A, external leads 310 are provided in the upper and lower end portions of the multilayer wiring ceramic package 300Z.

In the solid-state imaging device, the image sensor chip 100 is configured such that there is little power consumption in the imaging region PA, and most of power consumption occurs in the peripheral region SA where a peripheral circuit, such as an output circuit having a source follower circuit, is provided. In the solid-state imaging device, the image sensor chip 100 has power consumption higher than the signal processing chip 200.

For this reason, in the solid-state imaging device, the signal processing chip 200 becomes a heat source, and heat of the signal processing chip 200 is transmitted to the imaging region PA of the image sensor chip 100, causing a rise in temperature of the imaging region PA. As a result, the dark current characteristic may be significantly deteriorated.

FIG. 25 is a diagram showing the relationship between environmental temperature and dark current in a solid-state imaging device.

As shown in FIG. 25, it can be understood that, with a rise in temperature of several ° C. to 10° C., the occurrence of dark current is deteriorated about 1.5 to 3 times.

With the occurrence of dark current, the image quality of captured images may be degraded.

Hence, in the solid-state imaging device, it is difficult to realize reduction in size and improvement in the image quality of captured images.

SUMMARY OF THE INVENTION

Disclosed herein are one or more inventions that provide a solid-state imaging device and an electronic apparatus, which are capable of easily realizing a reduction in size thereof and an improvement in the image quality of captured images.

According to an embodiment, a solid-state imaging device includes a substrate, an image sensor chip, a signal processing circuit, and a low thermal conductivity region. The image sensor chip is carried on the substrate. The signal processing circuit is carried on the substrate and is configured to process an output from the image sensor chip. The low thermal conductivity region is positioned between the image sensor chip and the signal processing circuit. The low thermal conductivity region has a thermal conductivity lower than that of the substrate.

According to an embodiment, a solid-state imaging device includes an image sensor chip, a signal processing chip, and a low thermal conductivity region. The signal processing chip is electrically connected to the image sensor chip. The low thermal conductivity region is positioned between the image sensor chip and the signal processing chip. The low thermal conductivity region is effective to insulate the image sensor chip from heat generated by the signal processing chip.

According to an embodiment, an electronic apparatus includes a solid-state imaging device and a control section, configured to control the solid-state imaging device. The solid-state image device includes (a) a substrate, (b) an image sensor chip, (c) a signal processing circuit, and (d) a low thermal conductivity region. The image sensor chip is on the substrate. The signal processing circuit is configured to process an output from the image sensor chip. The low thermal conductivity region is positioned between the image sensor chip and the signal processing circuit. The low thermal conductivity region has a thermal conductivity lower than that of the substrate.

These embodiments are able to achieve at least a reduction in size and an improvement in the image quality of captured images.

BRIEF DESCRIPTION OF THE DRAWINGS

FIGS. 6A and 6B are diagrams showing an aspect of heat transmission in a solid-state imaging device according to Embodiment 1.

FIGS. 7A to 7C are diagrams showing the configuration of a solid-state imaging device according to Embodiment 2.

FIGS. 8A to 8C are diagrams showing the configuration of a solid-state imaging device according to Embodiment 3.

FIGS. 9A to 9C are diagrams showing the configuration of a solid-state imaging device according to Embodiment 4.

FIGS. 10A to 10C are diagrams showing the configuration of a solid-state imaging device according to Embodiment 5.

FIGS. 11A to 11C are diagrams showing the configuration of a solid-state imaging device according to Embodiment 6.

FIGS. 12A to 12C are diagrams showing the configuration of a solid-state imaging device according to Embodiment 7.

FIGS. 13A to 13C are diagrams showing the configuration of a solid-state imaging device according to Embodiment 8.

FIGS. 14A to 14C are diagrams showing the configuration of a solid-state imaging device according to Embodiment 9.

FIGS. 15A to 15C are diagrams showing the configuration of a solid-state imaging device according to Embodiment 9.

FIGS. 16A to 16C are diagrams showing the configuration of a solid-state imaging device according to Embodiment 10.

FIGS. 17A to 17C are diagrams showing the configuration of a solid-state imaging device according to Embodiment 10.

FIG. 18 is a diagram showing the configuration of a solid-state imaging device according to Embodiment 11.

FIG. 19 is a diagram showing the configuration of a solid-state imaging device according to Embodiment 12.

FIG. 23 is a diagram showing the configuration of a solid-state imaging device according to Embodiment 16.

DESCRIPTION OF THE PRESENTLY PREFERRED EMBODIMENTS

Hereinafter, devices and constructions embodying principles of the present invention(s) (herein referred to as embodiments) will be described. The description will be carried out in the following order.

1. Embodiment 1 (when a concave portion is provided in the upper surface of a package)
2. Embodiment 2 (when a concave portion is provided in the lower surface of a package)
3. Embodiment 3 (when concave portions are provided in the upper and lower surfaces of a package)
4. Embodiment 4 (when a through hole is provided in a package)
5. Embodiment 5 (when a through hole of a package differs in width between upper and lower portions)
6. Embodiment 6 (when a hollow portion is provided in a package)
7. Embodiment 7 (when a CCD and an AFE are accommodated in different steps)
8. Embodiment 8 (when a CCD is provided using an intermediate plate)
9. Embodiment 9 (when a CCD is provided only in corner portions)
10. Embodiment 10 (when a CCD is provided using a spacer)
11. Embodiment 11 (when a CCD is bare-mounted on an AFE)
12. Embodiment 12 (when a CCD is bare-mounted on an AFE)
13. Embodiment 13 (when a CCD is bare-mounted on an AFE)

14. Embodiment 14 (when a CCD is bare-mounted on an AFE)

15. Embodiment 15 (when a CCD is bare-mounted on an AFE)

16. Embodiment 16 (when a CCD is bare-mounted on an AFE)

17. Others

<1. Embodiment 1>

[A] Device Configuration

[A-1] Configuration of Main Part of Camera

Figure 1:
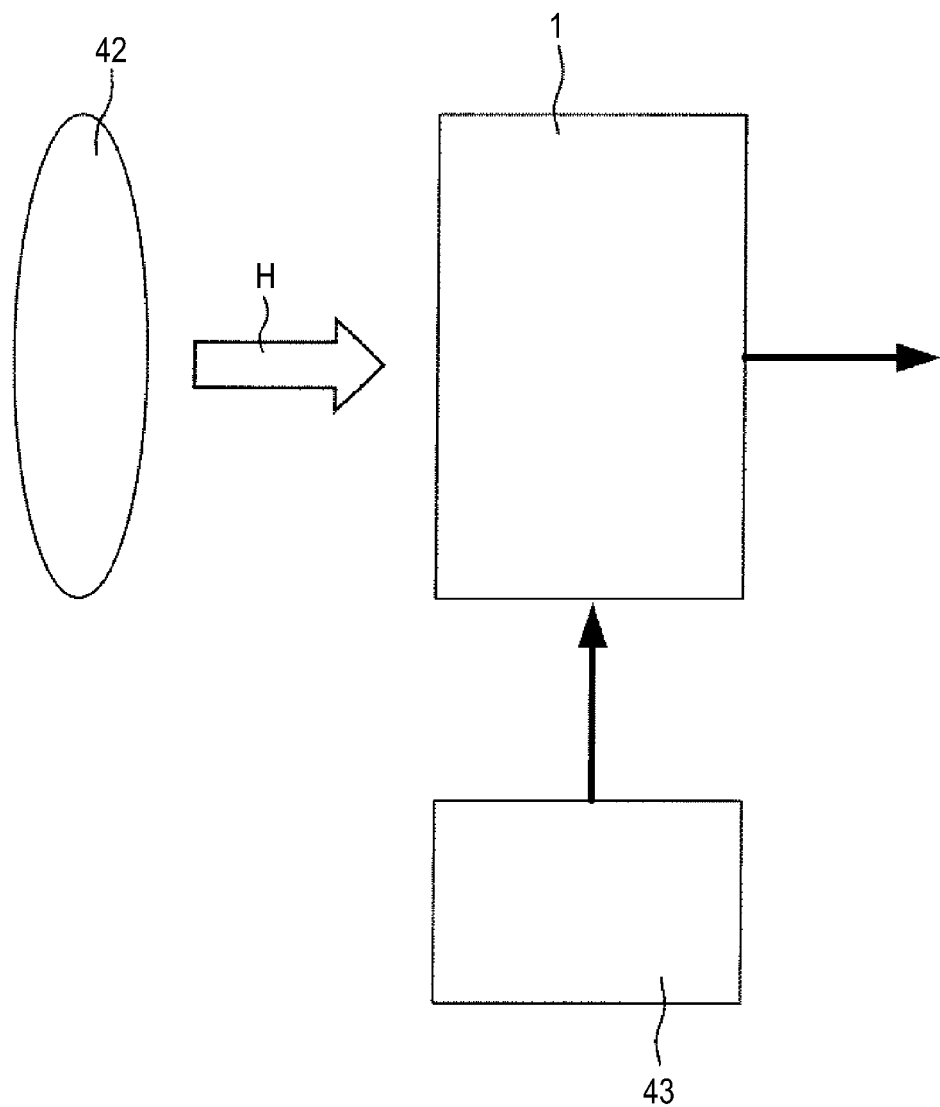
FIG. 1 is a configuration diagram showing the configuration of a camera according to Embodiment 1.

FIG. 1 is a configuration diagram showing the configuration of a camera 40 according to Embodiment 1.

As shown in FIG. 1, the camera 40 has a solid-state imaging device 1, an optical system 42, and a control section 43. The respective sections will be described in sequence.

The solid-state imaging device 1 receives incident light H input through the optical system 42 on an imaging surface and carries out photoelectric conversion to generate signal charges. Thereafter, signal processing is performed to generate and output a digital signal.

The optical system 42 includes an optical member, such as an imaging lens and/or a diaphragm, and is arranged so as to focus incident light by a subject image on the imaging surface of the solid-state imaging device 1.

The control section 43 outputs various control signals to the solid-state imaging device 1, and controls and drives the solid-state imaging device 1.

[A-2] Configuration of Main Part of Solid-State Imaging Device

The overall configuration of the solid-state imaging device 1 will be described.

Figure 2:
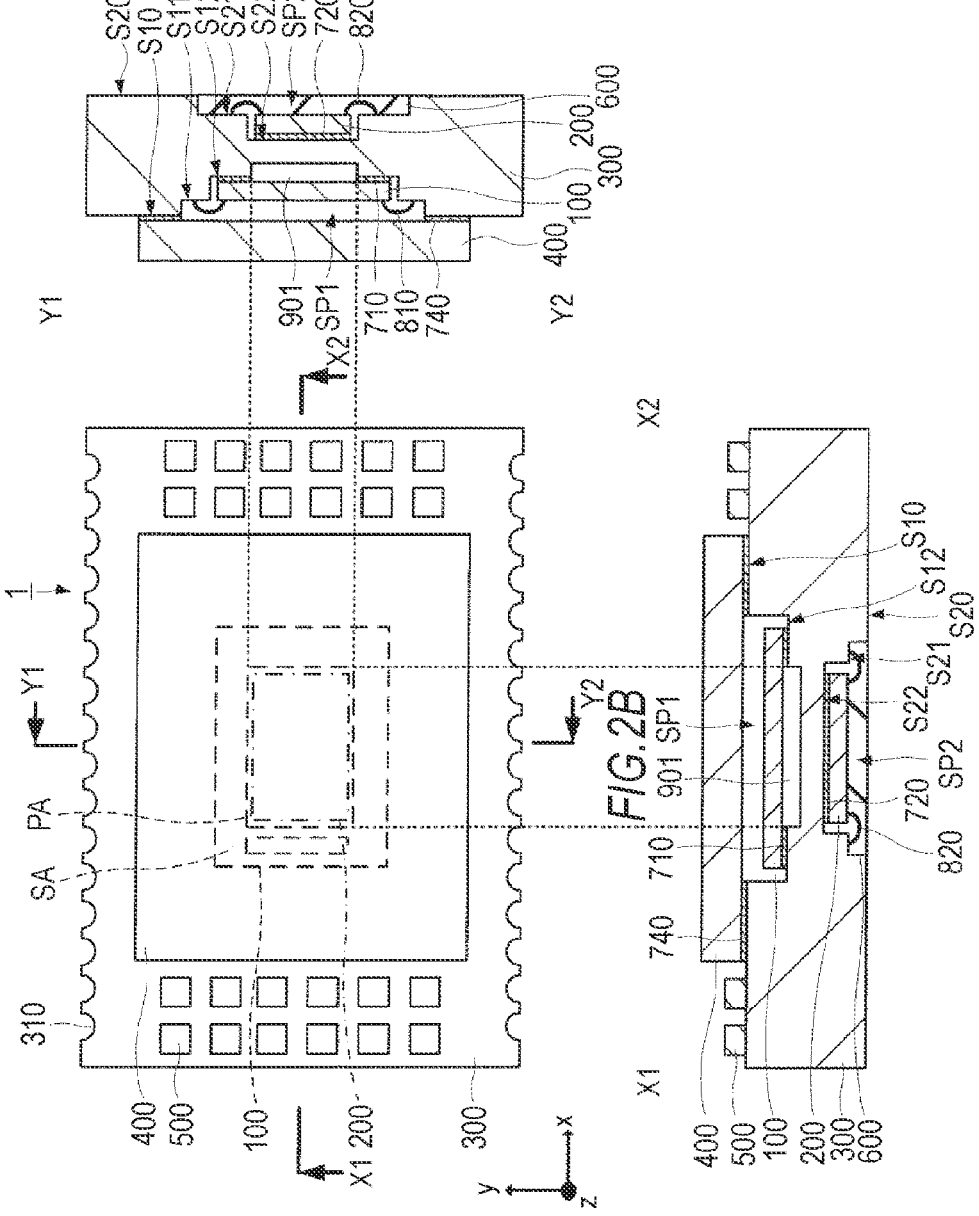
FIGS. 2A to 2C are diagrams showing the configuration of a solid-state imaging device according to Embodiment 1.

FIGS. 2A to 2C are diagrams showing the configuration of the solid-state imaging device 1 according to Embodiment 1.

FIG. 2A shows an upper surface of the solid-state imaging device in plan view. FIG. 2B shows a cross-section taken along the line X1-X2 of FIG. 2A. FIG. 2C shows a cross-section taken along the line Y1-Y2 of FIG. 2A.

As shown in FIGS. 2A to 2C, the solid-state imaging device 1 includes an image sensor chip 100, a signal processing chip 200, a multilayer wiring ceramic package 300, and a low-thermal-conductivity layer 901.

The respective sections constituting the solid-state imaging device 1 will be described in sequence.

(a) Image Sensor Chip 100

As shown in FIGS. 2A to 2C, the image sensor chip 100 is mounted in the multilayer wiring ceramic package 300.

As shown in FIG. 2A, the image sensor chip 100 is provided with an imaging region PA and a peripheral region SA in the surface thereof.

The image sensor chip 100 receives incident light input as a subject image in the imaging region PA and generates signal charges. In the imaging region PA, a plurality of pixels (not shown) are arranged in a matrix, and an output circuit (not shown) which is provided in the peripheral region SA around the imaging region PA outputs the signal charges transferred from the imaging region PA as an output signal.

As shown in FIGS. 2B and 2C, the image sensor chip 100 is provided on the upper surface of the multilayer wiring ceramic package 300.

The image sensor chip 100 is accommodated inside an accommodating space SP1 which is depressed in a concave shape in the upper surface of the multilayer wiring ceramic package 300. The image sensor chip 100 is mounted by means of a die bond material 710 on a surface S12 of the accommodating space SP1. Surface S12 may serve as a die attachment surface. As shown in FIG. 2B, a step is provided in the accommodating space SP1, and wires 810 are provided between a surface S11 of the step and the surface of the image sensor chip 100 to electrically connect the surface S11 of the step and the surface of the image sensor chip 100.

Figure 3:
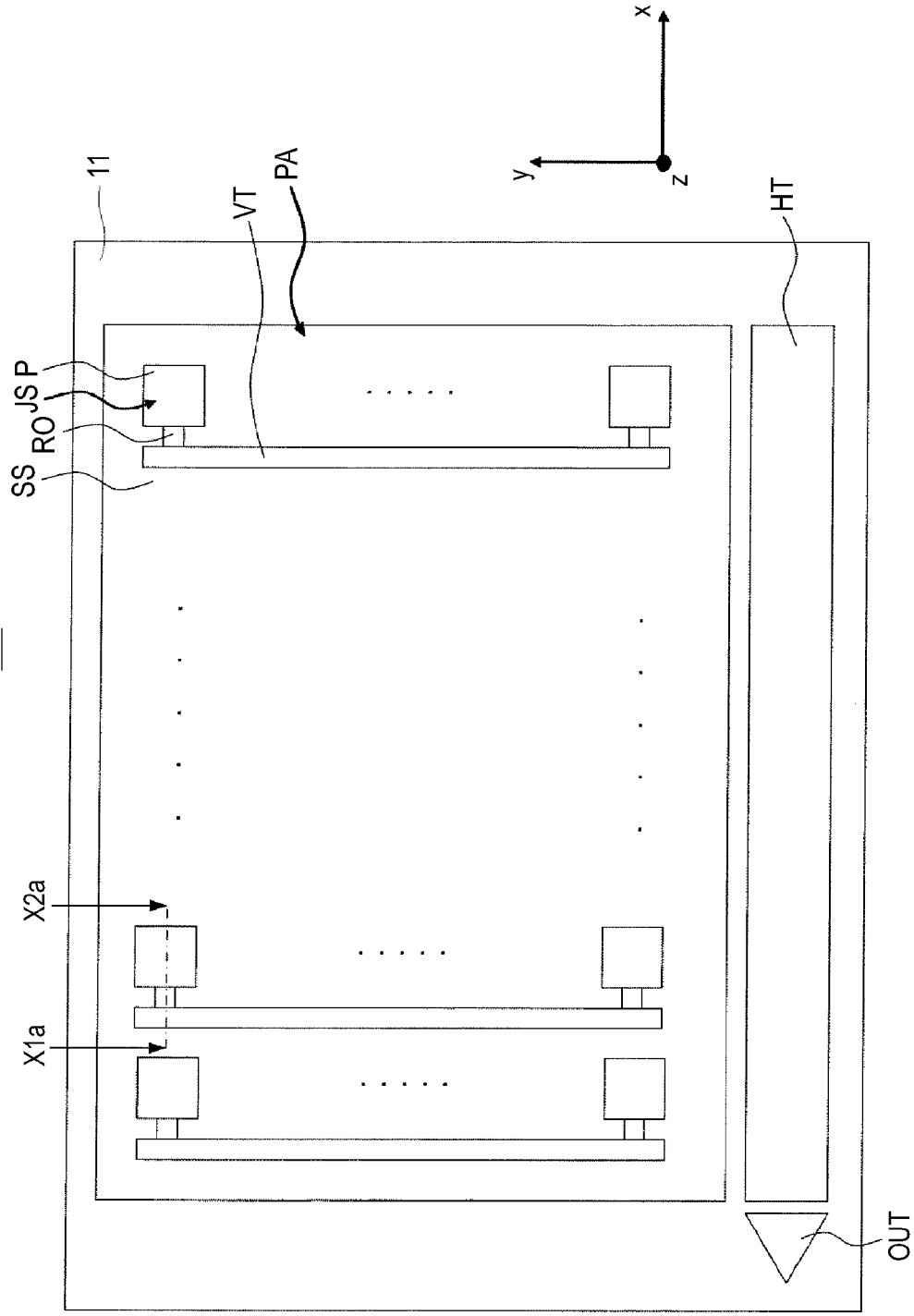
FIG. 3 is a diagram showing a main part of an image sensor chip according to Embodiment 1.
Figure 4:
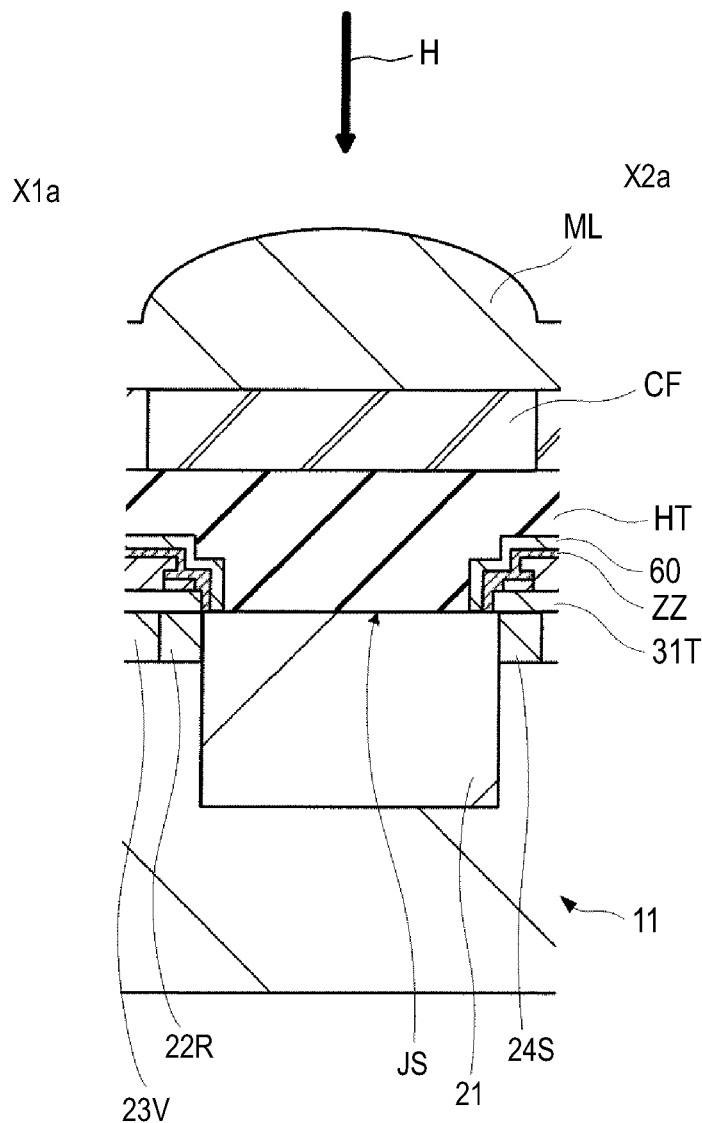
FIG. 4 is a diagram showing a main part of an image sensor chip according to Embodiment 1.

FIGS. 3 and 4 are diagrams showing the main part of the image sensor chip 100 in Embodiment 1. FIG. 3 schematically shows the upper surface of the image sensor chip 100 in plan view. FIG. 4 shows a cross-section taken along the line X1a-X2a of FIG. 3.

As shown in FIG. 3, the image sensor chip 100 is, for example, an interline CCD solid-state imaging element. The image sensor chip 100 has a semiconductor substrate 11, and the imaging region PA and the peripheral region SA are provided in the surface of the semiconductor substrate 11.

As shown in FIG. 3, pixels P, charge readout portions RO, vertical transfer register portions VT, and element separation portions SS are provided in the imaging region PA. Meanwhile, a horizontal transfer register portion HT and an output portion OUT are provided in the peripheral region SA.

(a-1) Pixel P

As shown in FIG. 3, a plurality of pixels P are provided in the imaging region PA and arranged in parallel in a matrix in the horizontal direction x and the vertical direction y.

As shown in FIG. 4, a photodiode 21 is provided in each pixel P. The photodiode 21 receives incident light H on a light receiving surface JS and carries out photoelectric conversion to generate signal charges.

Specifically, the photodiode 21 is provided in a front-side portion inside the semiconductor substrate 11. Though not shown, the photodiode 21 is configured, for example, such that an n-type semiconductor region (n) (not shown) and a p-type semiconductor region (p+) (not shown) are sequentially formed on the p-type semiconductor well region (p) (not shown) formed inside the semiconductor substrate 11. The n-type semiconductor region (n) functions as a signal charge accumulation region. The p-type semiconductor region (p+) functions as a hole accumulation region and suppresses the occurrence of dark current in the n-type semiconductor region (n) as the signal charge accumulation region.

As shown in FIG. 4, on the photodiode 21, a color filter CF and an on-chip lens ML are provided on a planarization film HT.

The color filter CF colors incident light by a subject image and transmits light to the light receiving surface JS of the semiconductor substrate 11.

Figure 5:
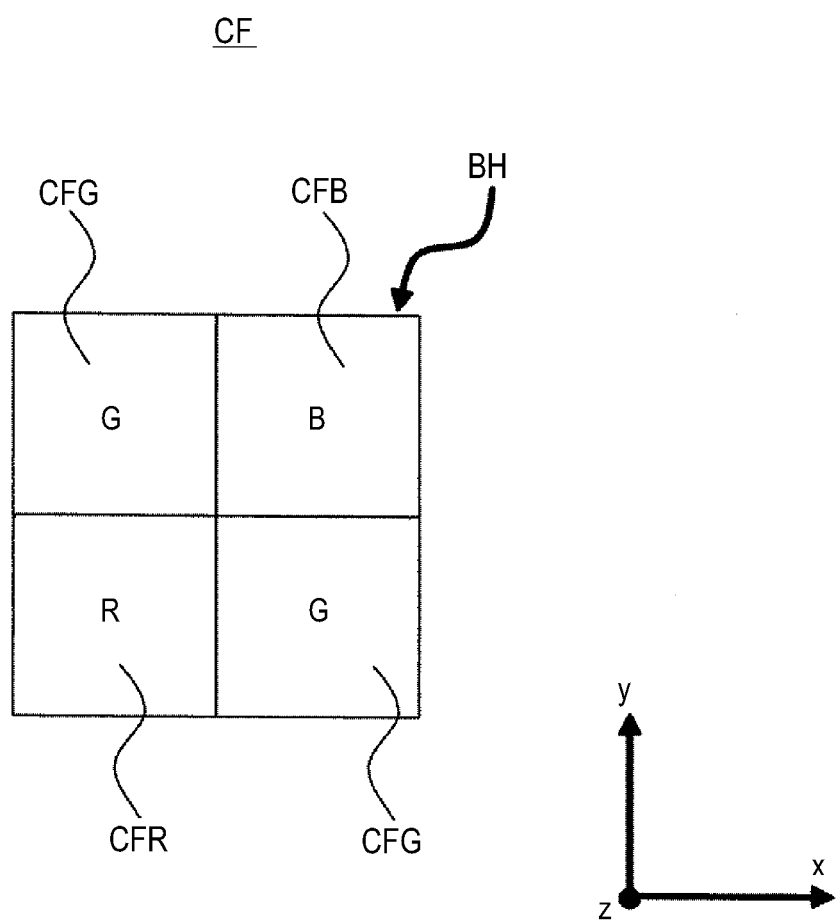
FIG. 5 is a diagram showing a color filter CF according to Embodiment 1.

FIG. 5 is a diagram showing the color filter CF according to Embodiment 1. FIG. 5 shows the upper surface of the color filter CF.

As shown in FIG. 5, the color filter CF includes a red filter layer CFR, a green filter layer CFG, and a blue filter layer CFB. The red filter layer CFR, the green filter layer CFG, and the blue filter layer CFB are adjacent to each other and provided to correspond to a plurality of pixels P.

As shown in FIG. 5, the red filter layer CFR, the green filter layer CFG, and the blue filter layer CFB are arranged in parallel in a Bayer array BH. That is, a plurality of green filter layers CFG are arranged in parallel in the diagonal direction to have a checkered pattern. The red filter layer CFR and the blue filter layer CFB are arranged in parallel in the diagonal direction with respect to a plurality of green filter layers CFG.

As shown in FIG. 4, a plurality of on-chip lenses ML are arranged on the upper surface of the color filter CF so as to correspond to the pixels P. Each of the on-chip lenses ML is a convex lens which is formed above the light receiving surface JS such that the center is thicker than the edge and focuses incident light H on the light receiving surface JS of the photodiode 21.

In each pixel P, the photodiode 21 receives incident light H on the light receiving surface JS via the above-mentioned portions (e.g., on-chip lens, color filter, and planarization film).

(a-2) Charge Readout Portion RO, Vertical Transfer Register Portion VT, Element Separation Portion SS As shown in FIG. 3, a plurality of charge readout portions RO are provided in the imaging region PA so as to correspond to a plurality of pixels P. Each charge readout portion RO reads out signal charges generated in the corresponding pixel P to the corresponding vertical transfer register portion VT.

As shown in FIG. 4, each charge readout portion RO is provided with a charge readout channel region 22R and reads out signal charges generated by the photodiode 21.

Specifically, as shown in FIG. 4, the charge readout channel region 22R is provided so as to be adjacent to the photodiode 21 in the front-side portion inside the semiconductor substrate 11.

The charge readout channel region 22R is arranged on the left side of the photodiode 21 in the horizontal direction x. For example, the charge readout channel region 22R is constituted as a p-type semiconductor region.

As shown in FIG. 3, in the imaging region PA, each vertical transfer register portion VT extends in the vertical direction y so as to correspond to a plurality of pixels P arranged in the vertical direction y. Each vertical transfer register portion VT is arranged between columns of a plurality of pixels P arranged in the vertical direction y. A plurality of vertical transfer register portions VT are provided in the imaging region PA. A plurality of vertical transfer register portions VT are arranged in the horizontal direction x so as to correspond to a plurality of pixels P arranged in the horizontal direction x. Each vertical transfer register portion VT, so-called vertical transfer CCD, sequentially transfers the signal charges read out from each pixel P through the charge readout portion RO in the vertical direction y. For example, in each vertical transfer register portion VT, the signal charges are transferred through four-phase driving.

As shown in FIG. 4, each vertical transfer register portion VT is provided with a charge transfer channel region 23V. The charge transfer channel region 23V transfers the signal charges read out from the photodiode 21 by the charge readout portion RO in the charge transfer channel region 23V.

Specifically, as shown in FIG. 4, the charge transfer channel region 23V is provided adjacent to the charge readout channel region 22R in the front-side portion inside the semiconductor substrate 11.

The charge transfer channel region 23V is arranged on the left side of the charge readout channel region 22R in the horizontal direction x. For example, the charge transfer channel region 23V is configured such that an n-type semiconductor region (n) (not shown) is provided on a p-type semiconductor well region (p) (not shown) inside the semiconductor substrate 11.

As shown in FIG. 3, each element separation portion SS is provided so as to separate the pixels P in the periphery of a plurality of pixels P.

As shown in FIG. 4, each element separation portion SS is provided with a channel stopper region 24S.

Specifically, as shown in FIG. 4, the channel stopper region 24S is provided in the front-side portion inside the semiconductor substrate 11.

The channel stopper region 24S is provided so as to be interposed between the charge transfer channel region 23V and the photodiode 21 arranged in an adjacent column in the horizontal direction x. With regard to the cross-section in the vertical direction y, though not shown, the channel stopper region 24S is provided between two photodiodes 21 arranged in parallel in the vertical direction y.

The channel stopper region 24S is configured, for example, such that a p-type semiconductor region (p+) (not shown) is provided on a p-type semiconductor well region (p) (not shown) inside the semiconductor substrate 11 and forms a potential barrier to prevent the outflow and inflow of the signal changes.

As shown in FIG. 4, a transfer electrode 31T is provided in the charge readout portion RO, the vertical transfer register portion VT, and the element separation portion SS.

As shown in FIG. 4, the transfer electrode 31T is provided so as to face the charge readout channel region 22R and the charge transfer channel region 23V through a gate insulating film (not shown) on the upper surface of the semiconductor substrate 11.

The transfer electrode 31T functions as a charge readout electrode to read out the signal charges generated by the photodiode 21 in the charge readout portion RO. In addition, the transfer electrode 31T functions as a vertical transfer electrode to transfer the read signal charges in the vertical direction y in the vertical transfer register portion VT. Though not shown, a plurality of transfer electrodes 31T are arranged in parallel in the vertical direction y. The signal charges are transferred by sequentially supplying a four-phase driving pulse signal to the transfer electrodes 31T arranged in parallel in the vertical direction y.

For example, the transfer electrode 31T is made of a conductive material, such as polysilicon, and is formed on a gate insulating film (not shown) made of, for example, a silicon oxide film.

An antireflection film 322 is provided on the upper surface of the transfer electrode 31T. The transfer electrode 31T is covered with a light blocking film 60 through an insulating film ZZ.

(a-3) Horizontal Transfer Register Portion HT

As shown in FIG. 3, the horizontal transfer register portion HT is arranged in the lower end portion of the imaging region PA. The horizontal transfer register portion HT extends in the horizontal direction x and sequentially transfers the signal charges, which are transferred by each of a plurality of vertical transfer register portions VT in the vertical direction y, in the horizontal direction x. That is, the horizontal transfer register portion HT is a so-called horizontal transfer CCD and is driven with, for example, a two-phase driving pulse signal to transfer the signal charges transferred for each horizontal line (one row of pixels).

(a-4) Output Portion OUT

As shown in FIG. 3, the output portion OUT is provided in the left end portion of the horizontal transfer register portion HT. The output portion OUT has, for example, a source follower circuit, and converts the signal charges horizontally transferred by the horizontal transfer register portion HT to a voltage and outputs the voltage as an analog signal.

(b) Signal Processing Chip 200

As shown in FIGS. 2A to 2C, the signal processing chip 200 is mounted in the multilayer wiring ceramic package 300.

As shown in FIGS. 2B and 2C, the signal processing chip 200 is arranged in the lower surface opposite to the upper surface, in which the image sensor chip 100 is arranged, in the multilayer wiring ceramic package 300. The signal processing chip 200 is arranged so as to face the imaging region PA of the image sensor chip 100.

Specifically, as shown in FIGS. 2B and 2C, the signal processing chip 200 is accommodated inside an accommodating space SP2 which is depressed in a concave shape in the lower surface of the multilayer wiring ceramic package 300.

The signal processing chip 200 is mounted by means of a die bond material 720 on a bottom surface S22 of the accommodating space SP2. Surface S22 may serve as a die attachment surface. As shown in FIGS. 2B and 2C, a step is provided in the accommodating space SP2, and wires 820 are provided between a surface S21 of the step and the surface of the signal processing chip 200 provided on the bottom surface S22 to electrically connect the surface S21 of the step and the surface of the signal processing chip 200.

The signal processing chip 200 is configured such that a semiconductor device (not shown) is provided on a semiconductor substrate (not shown) and a multilayer wiring layer (not shown) including wiring lines (not shown) electrically connected to the semiconductor device is provided on the semiconductor substrate (not shown). The signal processing chip 200 performs signal processing for the output signal output from the image sensor chip 100 by using the semiconductor device provided on the semiconductor substrate. The signal processing chip 200 is, for example, an analog front end (AFE) or an analog-to-digital converter (ADC) and outputs the output signal as a digital signal output from the image sensor chip 100 as an analog signal.

(c) Multilayer Wiring Ceramic Package 300

As shown in FIGS. 2A to 2C, in the multilayer wiring ceramic package 300, both the image sensor chip 100 and the signal processing chip 200 are mounted.

The multilayer wiring ceramic package 300 is configured such that a multilayer wiring layer (not shown) is provided on a ceramic substrate (not shown) made of silicon. That is, in the multilayer wiring ceramic package 300, a plurality of wiring lines (not shown) are formed on the ceramic substrate (not shown) through interlayer insulating films (not shown) to form a multilayer structure. The multilayer wiring ceramic package 300 accommodates the image sensor chip 100 and the signal processing chip 200 and electrically connects the image sensor chip 100 and the signal processing chip 200 through wiring lines (not shown).

In this embodiment, the image sensor chip 100 and the signal processing chip 200 are respectively accommodated in the upper and lower surface of the multilayer wiring ceramic package 300. Then, for example, the image sensor chip 100 and the signal processing chip 200 are electrically connected to the multilayer wiring layers (not shown) provided on both surfaces of the ceramic substrate (not shown), such that the image sensor chip 100 and the signal processing chip 200 are electrically connected to each other. The image sensor chip 100 and the signal processing chip 200 are arranged so as to sandwich the ceramic substrate (not shown) constituting the multilayer wiring ceramic package 300 and the low-thermal-conductivity layer 901 therebetween.

Specifically, as shown in FIGS. 2B and 2C, in the multilayer wiring ceramic package 300, the image sensor chip 100 is provided in the upper surface. The accommodating space SP1 which is depressed in a concave shape is provided in the upper surface of the multilayer wiring ceramic package 300, and the image sensor chip 100 is accommodated inside the accommodating space SP1. The image sensor chip 100 is mounted to the multilayer wiring ceramic package 300 by means of the die bond material 710 with the surface S12 of the accommodating space SP1 as a die attachment surface. For example, a thermosetting adhesive (for example, silver paste) is used as the die bond material 710 to fix the image sensor chip 100.

As shown in FIG. 2B, a step is provided in the accommodating space SP1, and the wires 810 are provided between the surface S11 of the step and the surface of the image sensor chip 100 to electrically connect the surface S11 of the step and the surface of the image sensor chip 100. For example, the inner leads (wiring lines) (not shown) of the multilayer wiring ceramic package 300 and the image sensor chip 100 are electrically bonded to each other through the AU wires 810.

As shown in FIGS. 2B and 2C, a transparent glass plate 400 is bonded to the upper surface of the multilayer wiring ceramic package 300 by a seal material 740 so as to seal the accommodating space SP1.

Simultaneously, as shown in FIGS. 2B and 2C, discrete components 500 are provided in the peripheral portion of the glass plate 400 on the upper surface of the multilayer wiring ceramic package 300. For example, components, such as transistors, resistors, and capacitors, are provided as the discrete components 500.

Meanwhile, as shown in FIGS. 2B and 2C, the signal processing chip 200 is mounted on the lower surface of the multilayer wiring ceramic package 300. The accommodating space SP2 which is depressed in a concave shape is provided in the lower surface of the multilayer wiring ceramic package 300, and the signal processing chip 200 is accommodated inside the accommodating space SP2. The signal processing chip 200 is mounted with the die bond material 720 onto surface S22 of the accommodating space SP2. Surface S22 may serve as a die attachment surface. For example, a thermosetting adhesive is used as the die bond material 720 to fix the signal processing chip 200.

As shown in FIGS. 2B and 2C, a step is provided in the accommodating space SP2, and the wires 820 are provided between the surface S21 of the step and the surface of the signal processing chip 200 to electrically connect the surface S21 of the step and the surface of the signal processing chip 200. For example, the inner leads (not shown) of the multilayer wiring ceramic package 300 and the signal processing chip 200 are electrically bonded to each other through the Au wires 820.

As shown in FIGS. 2B and 2C, a filled layer 600 is provided in the lower surface of the multilayer wiring ceramic package 300 to fill the accommodating space SP2. For example, thermosetting or UV curable resin is filled in the accommodating space SP2 to provide the filled layer 600.

As shown in FIG. 2A, external leads 310 are provided in the upper and lower end portions of the multilayer wiring ceramic package 300. The external leads 310 are appropriately electrically connected to the inner leads through the multilayer wiring lines inside the multilayer wiring ceramic package 300.

(d) Low-Thermal-Conductivity Region/Layer 901

As shown in FIGS. 2B and 2C, a low thermal conductivity region 901 (which may also be referred to herein as a low-thermal-conductivity layer 901) is provided so as to be interposed between the image sensor chip 100 and the signal processing chip 200. The low-thermal-conductivity layer 901 is provided on the lower surface opposite to the upper surface, to which incident light is input, in the imaging region PA of the image sensor chip 100.

Specifically, as shown in FIGS. 2B and 2C, the low-thermal-conductivity layer 901 is provided on the upper surface of the multilayer wiring ceramic package 300. The low-thermal-conductivity layer 901 is formed in a portion of the surface S12, on which the image sensor chip 100 is mounted, corresponding to the imaging region PA inside the accommodating space SP1 provided in the upper surface of the multilayer wiring ceramic package 300. The low-thermal-conductivity layer 901 is provided so as to face the entire surface of the imaging region PA of the image sensor chip 100. That is, the image sensor chip 100 is bonded to the surface S12 as a die attachment surface in the peripheral region SA, and the lowthermal-conductivity layer 901 is interposed between the imaging region PA of the image sensor chip 100 and the signal processing chip 200.

The low-thermal-conductivity layer 901 has thermal conductivity lower than the ceramic substrate constituting the multilayer wiring ceramic package 300. The low-thermal-conductivity layer 901 insulates heat which is transmitted from the heat-generating signal processing chip 200 to the imaging region PA of the image sensor chip 100.

As shown in FIGS. 2B and 2C, the low-thermal-conductivity layer 901 may include, for example, air (e.g., an air layer). In the accommodating space SP1, a trench portion which is provided to have a concave shape in the surface S12, on which the image sensor chip 100 is provided, is formed as the low-thermal-conductivity layer 901. The low-thermal-conductivity layer 901 is formed so as to have a thickness of, for example, 0.2 to 0.3 mm.

Additionally and/or alternatively to the above-mentioned air layer, the low-thermal-conductivity layer 901 may include and/or be made of an organic material, such as epoxy resin.

[B] Operation

FIGS. 6A and 6B are diagrams schematically showing an aspect of heat transmission in the solid-state imaging device 1 according to Embodiment 1 on a magnified scale.

FIG. 6A shows a case where there is no low-thermal-conductivity layer 901, unlike Embodiment 1. Specifically, in the multilayer wiring ceramic package 300, multilayer wiring layers 31 and 32 are respectively provided on the upper and lower surfaces of a ceramic substrate 30. In this case, accommodating spaces SP1 and SP2 are provided such that the upper and lower surfaces of the ceramic substrate 30 are exposed, and an image sensor chip 100 and a signal processing chip 200 are respectively mounted in the accommodating spaces SP1 and SP2. That is, FIG. 6A shows a case where the image sensor chip 100 and the signal processing chip 200 with only the ceramic substrate 30 sandwiched therebetween while there is no low-thermal-conductivity layer 901, unlike FIG. 6B. In addition, conductors (not shown) which electrically connect wiring lines in the multilayer wiring layers 31 and 32 are separately provided.

Meanwhile, as in this embodiment, FIG. 6B shows a case where there is the low-thermal-conductivity layer 901. Specifically, unlike FIG. 6A, a trench is formed in the upper surface of the ceramic substrate 30, and an air layer in the trench portion is formed as the low-thermal-conductivity layer 901. That is, in this case, the image sensor chip 100 and the signal processing chip 200 sandwich the ceramic substrate 30 and the low-thermal-conductivity layer 901 therebetween.

The image sensor chip 100 has power consumption lower than that of the signal processing chip 200. In the image sensor chip 100, most of power consumption occurs in a peripheral circuit, such as an output circuit, provided in the peripheral region SA, and there is little power consumption in the imaging region PA.

For this reason, as shown in FIG. 6A, heat Q generated from the signal processing chip 200 may be transmitted to the imaging region PA of the image sensor chip 100 through the multilayer wiring ceramic package 300. For this reason, as described above, arise in temperature may occur in the imaging region PA of the image sensor chip 100, significantly deteriorating the dark current characteristic.

However, in this embodiment, as shown in FIG. 6B, the low-thermal-conductivity layer 901 is provided between the imaging region PA of the image sensor chip 100 and the signal processing chip 200, which are arranged to face each other.

The low-thermal-conductivity layer 901 has thermal conductivity lower than the ceramic substrate constituting the multilayer wiring ceramic package 300. The imaging region PA of the image sensor chip 100 is insulated by the low-thermal-conductivity layer 901, which prevents heat Q from being transmitted from the signal processing chip 200 to the imaging region PA.

The peripheral region SA of the image sensor chip 100 is bonded to the surface S12 of the multilayer wiring ceramic package 300, such that heat Q of the peripheral region SA is transmitted to the multilayer wiring ceramic package 300 and released.

Therefore, in this embodiment, it is possible to suppress a rise in temperature of the imaging region PA in the image sensor chip 100.

Specifically, in this embodiment, the temperature is lowered by about 2° C. compared to a case where there is no low-thermal-conductivity layer 901.

Figure 25:
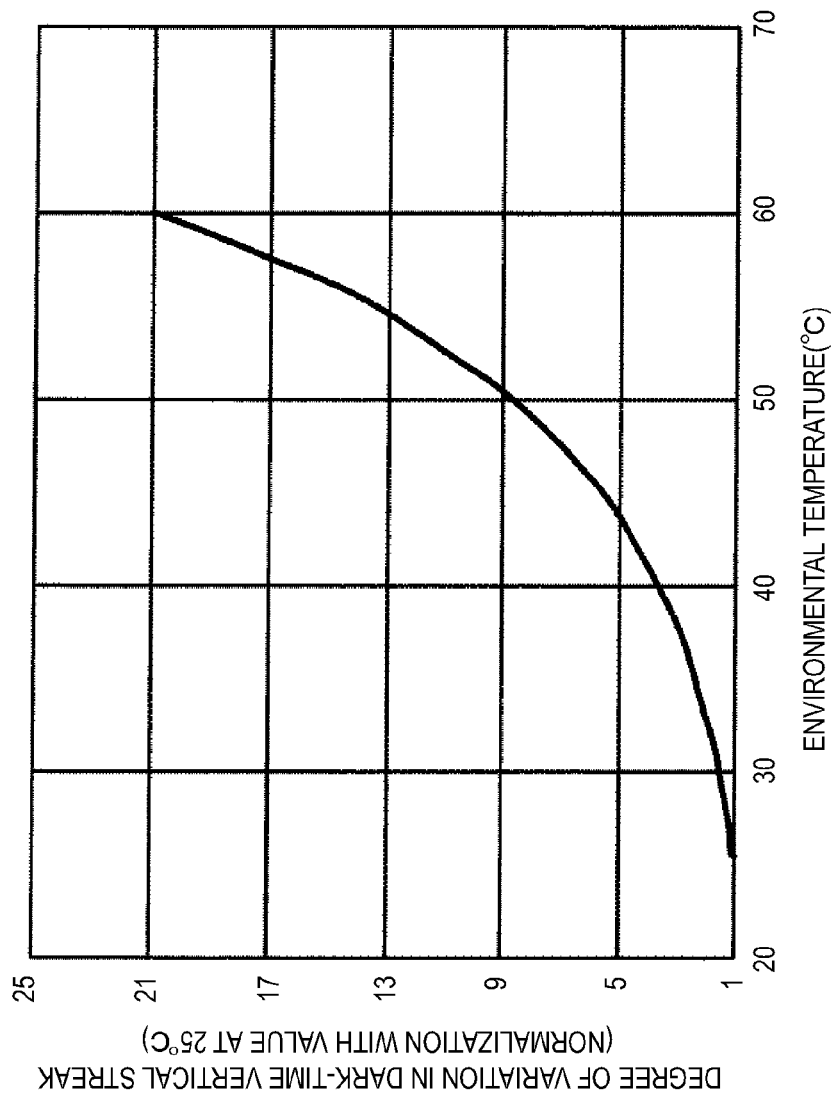
FIG. 25 is a diagram showing a relationship between environmental temperature and dark current in a solid-state imaging device.

Therefore, as will be understood from the FIG. 25, in this embodiment, it is possible to reduce the occurrence of dark current by about 20%.

[C] Conclusion

As described above, in this embodiment, the image sensor chip 100 is provided in one surface of the multilayer wiring ceramic package 300. The signal processing chip 200 is provided in the other surface of the multilayer wiring ceramic package 300 opposite to the surface in which the image sensor chip 100 is provided. The multilayer wiring ceramic package 300 electrically connects the image sensor chip 100 and the signal processing chip 200 through the wiring lines (see FIGS. 2A to 2C and the like).

In this embodiment, the low-thermal-conductivity layer 901 is provided so as to be interposed between the imaging region PA of the image sensor chip 100 and the signal processing chip 200, which are arranged to face each other. A trench is formed in a portion corresponding to the imaging region PA in one surface of the ceramic substrate 30 of the multilayer wiring ceramic package 300, and the low-thermal-conductivity layer 901 is provided in the trench portion. The peripheral region SA around the imaging region PA in the image sensor chip 100 is bonded to a portion around the trench on one surface of the ceramic substrate 30 of the multilayer wiring ceramic package 300. The low-thermal-conductivity layer 901 may include a region (e.g. an air layer) having thermal conductivity lower than that of the ceramic substrate 30, on which the multilayer wiring layers 31 and 32 are provided, in the multilayer wiring ceramic package 300 (see FIGS. 2A to 2B, 6A and 6B, and the like).

For this reason, as described above, the imaging region PA of the image sensor chip 100 is insulated by the low-thermal-conductivity layer 901 from heat which may travel from the signal processing chip 200 towards the image sensor chip 100. It is also possible to release heat of the peripheral region SA of the image sensor chip 100 to the multilayer wiring ceramic package 300.

Therefore, in this embodiment, even when the device is reduced in size, it is possible to suppress the occurrence of dark current in the image sensor chip 100, thereby improving the image quality of captured images.

<2. Embodiment 2>

[A] Device Configuration and the Like

FIGS. 7A to 7C are diagrams showing the configuration of a solid-state imaging device according to Embodiment 2.

Similarly to FIGS. 2A to 2C, FIGS. 7A to 7C schematically show a configuration of the solid-state imaging device. FIG. 7A shows an upper surface of the solid-state imaging device in plan view. FIG. 7B shows a cross-section taken along the line X1-X2 of FIG. 7A. FIG. 7C shows a cross-section taken along the line Y1-Y2 of FIG. 7A.

As shown in FIGS. 7A to 7C, in this embodiment, a low-thermal-conductivity layer 902 is different from low-thermal conductivity layer 901 in Embodiment 1. This embodiment is the same as Embodiment 1, excluding this point and related points. For this reason, a description of overlapping portions will be omitted.

As shown in FIGS. 7B and 7C, as in Embodiment 1, the low-thermal-conductivity layer 902 is interposed between the image sensor chip 100 and the signal processing chip 200.

As in Embodiment 1, the low-thermal-conductivity layer 902 may include air and/or any other material, which has thermal conductivity lower than the ceramic substrate constituting the multilayer wiring ceramic package 300. For this reason, the low-thermal-conductivity layer 902 insulates heat, which may travel from the heat-generating signal processing chip 200 toward the imaging region PA of the image sensor chip 100.

However, as shown in FIGS. 7B and 7C, the low-thermal-conductivity layer 902 is provided at a position that is different from a position of the low-thermal-conductivity layer 901, shown in Embodiment 1.

Specifically, as shown in FIGS. 7B and 7C, the low-thermal-conductivity layer 902 is formed in the lower surface of the multilayer wiring ceramic package 300. The low-thermal-conductivity layer 902 is formed in a portion corresponding to the imaging region PA in the surface S22, on which the signal processing chip 200 is mounted, inside the accommodating space SP2 in the lower surface of the multilayer wiring ceramic package 300. That is, the low-thermal-conductivity layer 902 is interposed between the imaging region PA of the image sensor chip 100 and the signal processing chip 200.

As shown in FIGS. 7B and 7C, a trench portion which is provided to have a concave shape in the surface S22, on which the signal processing chip 200 is provided, in the accommodating space SP2 is formed as the low-thermal-conductivity layer 902.

A trench is formed in a portion corresponding to the imaging region PA in the lower surface of the multilayer wiring ceramic package 300 (for example, the lower surface of the ceramic substrate 30 of FIGS. 6A and 6B). The low-thermal-conductivity layer 902 is provided in the trench portion.

For this reason, in this embodiment, as shown in FIGS. 7B and 7C, the image sensor chip 100 is bonded to the multilayer wiring ceramic package 300 over the entire surface facing the surface S12 as a die attachment surface.

Meanwhile, as shown in FIGS. 7B and 7C, the signal processing chip 200 is bonded to the multilayer wiring ceramic package 300 with the peripheral portion of the surface of the signal processing chip 200 facing the surface S22, serving as a die attachment surface. That is, the peripheral portion of the signal processing chip 200 is bonded to a portion around the trench as the low-thermal-conductivity layer 902 in the lower surface of the multilayer wiring ceramic package 300.

[B] Conclusion

As described above, in this embodiment, similarly to Embodiment 1, the low-thermal-conductivity layer 902 is provided so as to be interposed between the imaging region PA of the image sensor chip 100 and the signal processing chip 200 arranged to face each other.

For this reason, heat which may be transmitted from the heat-generating signal processing chip 200 to the imaging region PA of the image sensor chip 100 is insulated by the low-thermal-conductivity layer 902.

Particularly, in this embodiment, the low-thermal-conductivity layer 902 is provided closer to the signal processing chip 200 as a heat source than the image sensor chip 100. For this reason, it is possible to more effectively insulate heat transmitted from the signal processing chip 200 to the imaging region PA of the image sensor chip 100 by the low-thermal-conductivity layer 902.

In addition, it is possible to release heat of the peripheral region SA of the image sensor chip 100 to the multilayer wiring ceramic package 300.

Therefore, in this embodiment, even when the device is reduced in size, it is possible to suppress the occurrence of dark current in the image sensor chip 100, improving the image quality of captured images.

<3. Embodiment 3>

[A] Device Configuration and the Like

FIGS. 8A to 8C are diagrams showing the configuration of a solid-state imaging device according to Embodiment 3.

Similarly to FIGS. 2A to 2C, FIGS. 8A to 8C schematically show the configuration of the solid-state imaging device. FIG. 8A shows an upper surface of the solid-state imaging device in plan view. FIG. 8B shows a cross-section taken along the line X1-X2 of FIG. 8A. FIG. 8C shows a cross-section taken along the line Y1-Y2 of FIG. 8A.

As shown in FIGS. 8A to 8C, this embodiment is different from Embodiment 1 in that a plurality of low-thermal-conductivity layers 901 and 902 are provided. This embodiment is the same as Embodiment 1, excluding this point and related points. For this reason, description of the overlapping portions will be omitted.

In this embodiment, as shown in FIGS. 8B and 8C, as in Embodiment 1, a low-thermal-conductivity layer 901 is provided in the upper surface of the multilayer wiring ceramic package 300.

That is, a trench ("first trench") is formed in a portion corresponding to the imaging region PA in the upper surface of the multilayer wiring ceramic package 300, and the low-thermal-conductivity layer 901 is provided in the trench portion.

In addition, as shown in FIGS. 8B and 8C, unlike Embodiment 1, a low-thermal-conductivity layer 902 is provided in the lower surface of the multilayer wiring ceramic package 300.

As in Embodiment 2, the low-thermal-conductivity layer 902 is formed in a portion corresponding to the imaging region PA in the surface S22, on which the signal processing chip 200 is mounted, inside the accommodating space SP2 provided in the lower surface of the multilayer wiring ceramic package 300.

That is, as in Embodiment 2, a trench ("second trench") is formed in a portion corresponding to the imaging region PA in the lower surface of the multilayer wiring ceramic package 300, and the low-thermal-conductivity layer 902 is provided in the trench portion.

As described above, in this embodiment, a plurality of low-thermal-conductivity layers 901 and 902 are interposed between the imaging region PA of the image sensor chip 100 and the signal processing chip 200. The low-thermal-conductivity layers 901 and 902 may include air and/or any other material, which has a thermal conductivity lower than a thermal conductivity of the substrate on which the image sensor chip 100 and the signal processing chip 200 are mounted.

In this embodiment, as shown in FIGS. 8B and 8C, the image sensor chip 100 is bonded to the multilayer wiring ceramic package 300 with the peripheral portion of a surface of the image sensor chip 100 facing the surface S12 serving as a die attachment surface.

Similarly, as shown in FIGS. 8B and 8C, the signal processing chip 200 is bonded to the multilayer wiring ceramic package 300 with the peripheral portion of a surface of the signal processing chip 200 facing the surface S22 serving as a die attachment surface.

[B] Conclusion

As described above, in this embodiment, similarly to other embodiments, the low-thermal-conductivity layers 901 and 902 are provided so as to be interposed between the imaging region PA of the image sensor chip 100 and the signal processing chip 200 arranged to face each other.

For this reason, heat which may be transmitted from the heat-generating signal processing chip 200 to the imaging region PA of the image sensor chip 100 is insulated by the low-thermal-conductivity layers 901 and 902.

Particularly, in this embodiment, a plurality of low-thermal-conductivity layers 901 and 902 are provided, such that heat which may be transmitted from the signal processing chip 200 to the imaging region PA of the image sensor chip 100 is more effectively insulated.

It is also possible to release heat of the peripheral region SA of the image sensor chip 100 to the multilayer wiring ceramic package 300.

Therefore, in this embodiment, even when the device is reduced in size, it is possible to suppress the occurrence of dark current in the image sensor chip 100, improving the image quality of captured images.

<4. Embodiment 4>

[A] Device Configuration and the Like

FIGS. 9A to 9C are diagrams showing the configuration of a solid-state imaging device according to Embodiment 4.

Similarly to FIGS. 2A to 2C, FIGS. 9A to 9C schematically show the configuration of the solid-state imaging device. FIG. 9A shows an upper surface of the solid-state imaging device in plan view. FIG. 9B shows a cross-section taken along the line X1-X2 of FIG. 9A. FIG. 9C shows a cross-section taken along the line Y1-Y2 of FIG. 9A.

As shown in FIGS. 9A to 9C, in this embodiment, a low-thermal-conductivity layer 904 is different from Embodiment 1. This embodiment is the same as Embodiment 1, excluding this point and related points. For this reason, description of the overlapping portions will be omitted.

In this embodiment, as shown in FIGS. 9B and 9C, as in Embodiment 1, the low-thermal-conductivity layer 904 is interposed between the image sensor chip 100 and the signal processing chip 200.

As in Embodiment 1, the low-thermal-conductivity layer 904 may include air (e.g. an air layer) and/or any other material, which has thermal conductivity lower than a thermal conductivity of the ceramic substrate constituting the multilayer wiring ceramic package 300. For this reason, the low-thermal-conductivity layer 904 insulates heat which may be transmitted from the heat-generating signal processing chip 200 to the imaging region PA of the image sensor chip 100, thereby protecting the imaging region PA.

However, unlike Embodiment 1, the multilayer wiring ceramic package 300 is provided with a through hole which passes through the upper surface and the lower surface thereof. For example, a through hole is formed so as to pass through the one surface and the other surface of the ceramic substrate 30 shown in FIGS. 6A and 6B. This through hole is provided as the low-thermal-conductivity layer 904.

Specifically, the low-thermal-conductivity layer 904 is formed in a portion corresponding to the imaging region PA in the surface S12, on which image sensor chip 100 is mounted, inside the accommodating space SP1 provided in the upper surface of the multilayer wiring ceramic package 300. The low-thermal-conductivity layer 904 is formed in a portion corresponding to the central portion of the signal processing chip 200 in the surface S22, on which the signal processing chip 200 is mounted, inside the accommodating space SP2 provided in the lower surface of the multilayer wiring ceramic package 300. That is, the low-thermal-conductivity layer 904 is formed such that the upper surface and the lower surface thereof are narrower than the lower surface of the imaging region PA and the upper surface of the signal processing chip 200.

The image sensor chip 100 closes the upper surface of the through hole as the low-thermal-conductivity layer 904, and the signal processing chip 200 closes the lower surface of the low-thermal-conductivity layer 904.

For this reason, in this embodiment, as shown in FIGS. 9B and 9C, the image sensor chip 100 is bonded to the multilayer wiring ceramic package 300 by having a peripheral portion of a surface of the image sensor chip facing the surface S12, which serves as a die attachment surface. That is, the peripheral region SA around the imaging region PA in the image sensor chip 100 is bonded to a portion around the through hole on the upper surface of the multilayer wiring ceramic package 300.

Similarly, as shown in FIGS. 9B and 9C, the signal processing chip 200 is bonded to the multilayer wiring ceramic package 300 with the peripheral portion of a surface of the signal processing chip 200 facing the surface S22, serving as a die attachment surface. That is, the peripheral portion of the signal processing chip 200 is bonded to a portion around the through hole on the lower surface of the multilayer wiring ceramic package 300.

[B] Conclusion

As described above, in this embodiment, similarly to other embodiments, the low-thermal-conductivity layer 904 is provided so as to be interposed between the imaging region PA of the image sensor chip 100 and the signal processing chip 200, which are arranged to face each other.

For this reason, heat which may be transmitted from the heat-generating signal processing chip 200 to the imaging region PA of the image sensor chip 100 is insulated by the low-thermal-conductivity layer 904.

Particularly, in this embodiment, the low-thermal-conductivity layer 904 is provided over the entire direction (e.g., thickness direction) in which the imaging region PA of the image sensor chip 100 and the signal processing chip 200 face each other. For this reason, heat which may be transmitted from the signal processing chip 200 to the imaging region PA of the image sensor chip 100 is more effectively insulated.

In addition, it is possible to release heat of the peripheral region SA of the image sensor chip 100 to the multilayer wiring ceramic package 300.

Therefore, in this embodiment, even when the device is reduced in size, it is possible to suppress the occurrence of dark current in the image sensor chip 100, improving the image quality of captured images.

<5. Embodiment 5>

[A] Device Configuration and the Like

FIGS. 10A to 10C are diagrams showing the configuration of a solid-state imaging device according to Embodiment 5.

Similarly to FIGS. 2A to 2C, FIGS. 10A to 10C schematically show the configuration of the solid-state imaging device. FIG. 10A shows an upper surface of the solid-state imaging device in plan view. FIG. 10B shows a cross-section taken along the line X1-X2 of FIG. 10A. FIG. 10C shows a cross-section taken along the line Y1-Y2 of FIG. 10A.

As shown in FIGS. 10A to 10C, in this embodiment, a low-thermal-conductivity layer 905 is different from Embodiment 1. This embodiment is the same as Embodiment 1, excluding this point and related points. For this reason, description of the overlapping portions will be omitted.

In this embodiment, as shown in FIGS. 10B and 10C, as in Embodiment 1, the low-thermal-conductivity layer 905 is provided so as to be interposed between the image sensor chip 100 and the signal processing chip 200.

As in Embodiment 1, the low-thermal-conductivity layer 905 may include air (e.g., an air layer) and/or any other material, which has thermal conductivity lower than a thermal conductivity of the ceramic substrate constituting the multilayer wiring ceramic package 300. For this reason, the low-thermal-conductivity layer 905 insulates heat which may be transmitted from the heat-generating signal processing chip 200 to the imaging region PA of the image sensor chip 100.

However, unlike Embodiment 1, the multilayer wiring ceramic package 300 is provided with a through hole which passes through the upper surface and the lower surface thereof. For example, a through hole is formed so as to pass through the one surface and the other surface of the ceramic substrate 30 of the multilayer wiring ceramic package 300, which is shown in FIGS. 6A and 6B. This through hole is provided as or contributes to the formation of the low-thermal-conductivity layer 905.

As shown in FIGS. 10B and 10C, the low-thermal-conductivity layer 905 includes a first low-thermal-conductivity portion 905a and a second low-thermal-conductivity portion 905b.

In the low-thermal-conductivity layer 905, as shown in FIGS. 10B and 10C, the first low-thermal-conductivity portion 905a is formed in the upper surface of the multilayer wiring ceramic package 300. The first low-thermal-conductivity portion 905a is formed so as to have the same planar shape as the imaging region PA of the image sensor chip 100.

In the low-thermal-conductivity layer 905, as shown in FIGS. 10B and 10C, the second low-thermal-conductivity portion 905b is formed in the lower surface of the multilayer wiring ceramic package 300.

The second low-thermal-conductivity portion 905b is formed in a portion corresponding to the imaging region PA in the surface S22, on which the signal processing chip 200 is mounted, inside the accommodating space SP2 provided in the lower surface of the multilayer wiring ceramic package 300. The second low-thermal-conductivity portion 905b is formed in a portion corresponding to the central portion of the signal processing chip 200 in the surface S22, on which the signal processing chip 200 is mounted, inside the accommodating space SP2 provided in the lower surface of the multilayer wiring ceramic package 300.

That is, the second low-thermal-conductivity portion 905b is formed such that the upper surface and the lower surface thereof are narrower than the lower surface of the imaging region PA and the upper surface of the signal processing chip 200.

In the low-thermal-conductivity layer 905, the lower surface of the first low-thermal-conductivity portion 905a and the upper surface of the second low-thermal-conductivity portion 905b are connected to each other.

In such a manner, in the multilayer wiring ceramic package 300, the through hole is formed so as to differ in width between the upper surface and the lower surface. A width of the first low thermal conductivity portion 905a is different (e.g., larger) than a width of the second low thermal conductivity portion 905b.

In this embodiment, as shown in FIGS. 10B and 10C, the image sensor chip 100 is bonded to the multilayer wiring ceramic package 300 with the peripheral portion of a surface of the image sensor chip 100 facing the surface S12, serving as a die attachment surface.

Similarly, as shown in FIGS. 10B and 10C, the signal processing chip 200 is bonded to the multilayer wiring ceramic package 300 with the peripheral portion of a surface of the signal processing chip 200 facing the surface S22, serving as a die attachment surface.

[B] Conclusion

As described above, in this embodiment, similarly to other embodiments, the low-thermal-conductivity layer 905 is provided so as to be interposed between the imaging region PA of the image sensor chip 100 and the signal processing chip 200, which are arranged to face each other.

For this reason, the low-thermal-conductivity layer 905 insulates heat which may be transmitted from the heat-generating signal processing chip 200 to the imaging region PA of the image sensor chip 100.

Particularly, in this embodiment, the low-thermal-conductivity layer 905 is provided over the entire direction (e.g., thickness direction) in which the imaging region PA of the image sensor chip 100 and the signal processing chip 200 face each other. In the low-thermal-conductivity layer 905, the first low-thermal-conductivity portion 905a is provided over the entire imaging region PA of the image sensor chip 100. For this reason, heat which may be transmitted from the signal processing chip 200 to the imaging region PA of the image sensor chip 100 is more effectively insulated.

In addition, it is possible to release heat of the peripheral region SA of the image sensor chip 100 to the multilayer wiring ceramic package 300.

Therefore, in this embodiment, even when the device is reduced in size, it is possible to suppress the occurrence of dark current in the image sensor chip 100, improving the image quality of captured images.

<6. Embodiment 6>
[A] Device Configuration and the Like

FIGS. 11A to 11C are diagrams showing the configuration of a solid-state imaging device according to Embodiment 6.

Similarly to FIGS. 2A to 2C, FIGS. 11A to 11C schematically show the configuration of the solid-state imaging device. FIG. 11A shows an upper surface of the solid-state imaging device. FIG. 11B shows a cross-section taken along the line X1-X2 of FIG. 11A. FIG. 11C shows a cross-section taken along the line Y1-Y2 of FIG. 11A.

As shown in FIGS. 11A to 11C, in this embodiment, a low-thermal-conductivity layer 906 is different from Embodiment 1. This embodiment is the same as Embodiment 1, excluding this point and related points. For this reason, description of the overlapping portions will be omitted.

As shown in FIGS. 11B and 11C, as in Embodiment 1, the low-thermal-conductivity layer 906 is provided so as to be interposed between the image sensor chip 100 and the signal processing chip 200.

As in Embodiment 1, the low-thermal-conductivity layer 906 includes air (e.g., an air layer) and/or any other material, which has a thermal conductivity lower than a thermal conductivity of the ceramic substrate constituting the multilayer wiring ceramic package 300. For this reason, the low-thermal-conductivity layer 906 insulates heat which is transmitted from the heat-generating signal processing chip 200 to the imaging region PA of the image sensor chip 100.

However, as shown in FIGS. 11B and 11C, the low-thermal-conductivity layer 906 is provided at a position different from a position of the low thermal conductivity layer 901, shown in Embodiment 1.

Specifically, as shown in FIGS. 11B and 11C, the low-thermal-conductivity layer 906 is formed inside and/or between the upper surface and the lower surface of the multilayer wiring ceramic package 300. The low-thermal-conductivity layer 906 is interposed between the accommodating space SP1 provided in the upper surface and the accommodating space SP2 provided in the lower surface of the multilayer wiring ceramic package 300. For example, a hollow portion is formed between the upper surface and the lower surface of the ceramic substrate 30 of FIGS. 6A and 6B, and the low-thermal-conductivity layer 906 is provided in the hollow portion. That is, in the multilayer wiring ceramic package 300, with the low-thermal-conductivity layer 906 including an air layer, the ceramic substrate which is sandwiched between the image sensor chip 100 and the signal processing chip 200 may have a hollow structure.

For this reason, in this embodiment, as shown in FIGS. 11B and 11C, an entire surface of the image sensor chip 100 that faces surface S12 is bonded to the multilayer wiring ceramic package 300. Surface S12 may serve as a die attachment surface.

Similarly, as shown in FIGS. 11B and 11C, an entire surface of the signal processing chip 200 that faces surface S22 is bonded to the multilayer wiring ceramic package 300. Surface S22 may serve as a die attachment surface.

As shown in FIGS. 11B and 11C, the low-thermal-conductivity layer 906 is formed so as to have a planar shape wider than the imaging region PA of the image sensor chip 100. That is, the low-thermal-conductivity layer 906 is provided so as to face the entire surface of the peripheral region SA as well as the entire surface of the imaging region PA of the image sensor chip 100.

[B] Conclusion

As described above, in this embodiment, similarly to other embodiments, the low-thermal-conductivity layer 906 is provided so as to be interposed between the imaging region PA of the image sensor chip 100 and the signal processing chip 200, which are arranged to face each other.

For this reason, the low-thermal-conductivity layer 906 insulates heat which may be transmitted from the heat-generating signal processing chip 200 to the imaging region PA of the image sensor chip 100.

It is also possible to release heat of the peripheral region SA of the image sensor chip 100 to the multilayer wiring ceramic package 300.

Therefore, in this embodiment, even when the device is reduced in size, it is possible to suppress the occurrence of dark current in the image sensor chip 100, improving the image quality of captured images.

<7. Embodiment 7>

[A] Device Configuration and the Like

FIGS. 12A to 12C are diagrams showing the configuration of a solid-state imaging device according to Embodiment 7.

Similarly to FIGS. 2A to 2C, FIGS. 12A to 12C schematically show the configuration of the solid-state imaging device. FIG. 12A shows an upper surface of the solid-state imaging device in plan view. FIG. 12B shows a cross-section taken along the line X1-X2 of FIG. 12A. FIG. 12C shows a cross-section taken along the line Y1-Y2 of FIG. 12A.

As shown in FIGS. 12A to 12C, in this embodiment, in the multilayer wiring ceramic package 300, a surface on which the signal processing chip 200 is provided is different from that of Embodiment 1. This embodiment is the same as Embodiment 1, excluding this point and related points. For this reason, description of the overlapping portions will be omitted.

As shown in FIGS. 12A to 12C, as in Embodiment 1, in the multilayer wiring ceramic package 300, both the image sensor chip 100 and the signal processing chip 200 are mounted.

As shown in FIGS. 12B and 12C, unlike Embodiment 1, in the multilayer wiring ceramic package 300, both the image sensor chip 100 and the signal processing chip 200 are provided on the upper surface (i.e., on the same side of the surfaces).

As shown in FIGS. 12B and 12C, an accommodating space SP1 which is depressed in a concave shape is provided in the upper surface of the multilayer wiring ceramic package 300. For example, the multilayer wiring ceramic package 300 is provided with a multilayer wiring layer 31 on the upper surface of the ceramic substrate 30 of FIGS. 6A and 6B, and a trench formed in the multilayer wiring layer 31 is provided as the accommodating space SP1.

The accommodating space SP1 of the multilayer wiring ceramic package 300 is structured so as to be widened upward from the bottom surface in a stepwise manner. Inside the accommodating space SP1, both the image sensor chip 100 and the signal processing chip 200 are accommodated such that the image sensor chip 100 and the signal processing chip 200 are stacked with a low-thermal-conductivity layer 907 interposed therebetween. Inside the accommodating space SP1, the image sensor chip 100 and the signal processing chip 200 are electrically connected to each other through wiring lines.

Specifically, as shown in FIGS. 12B and 12C, the signal processing chip 200 is mounted by a die bond material 720 on a bottom surface S14 provided in the accommodating space SP1. Surface S14 may serve as a die attachment surface. For example, a thermosetting adhesive (for example, silver paste) is used as the die bond material 720 to fix the signal processing chip 200. That is, the signal processing chip 200 is mounted on the zero-th step (e.g., bottom surface) of the accommodating space SP1.

As shown in FIGS. 12B and 12C, a step is provided in the accommodating space SP1, and wires 820 are provided between an upper surface S13 of the step and the surface of the signal processing chip 200 to electrically connect the upper surface S13 of the step and the surface of the signal processing chip 200. For example, the inner leads (not shown) of the multilayer wiring ceramic package 300 and the signal processing chip 200 are electrically bonded to each other through the Au wires 820. That is, in the first step of the accommodating space SP1, the inner leads (not shown) and the signal processing chip 200 are electrically connected to each other.

As shown in FIGS. 12B and 12C, in the accommodating space SP1, the image sensor chip 100 is mounted through a die bond material 710 with an upper surface S12 of a step higher than the step, on which the wires 820 are provided, as a die attachment surface. For example, a thermosetting adhesive (for example, silver paste) is used as the die bond material 710 to fix the image sensor chip 100. That is, the image sensor chip 100 is mounted on the second step of the accommodating space SP1. At least a portion of the peripheral region SA of image sensor chip 100 is bonded to the second step of the accommodating space SP1. The image sensor chip 100 is configured such that the peripheral region SA around the imaging region PA is bonded to the multilayer wiring ceramic package 300.

As shown in FIG. 12C, wires 810 are provided between an upper surface S11 of a step higher than the step as a die attachment surface and the surface of the image sensor chip 100 to electrically connect the upper surface S11 of the step and the surface of the image sensor chip 100. For example, the inner leads (not shown) of the multilayer wiring ceramic package 300 and the image sensor chip 100 are electrically bonded to each other through the Au wires 810. That is, in the third step of the accommodating space SP1, the inner leads (not shown) and the image sensor chip 100 are electrically connected to each other.

As shown in FIGS. 12B and 12C, a transparent glass plate 400 is bonded to the upper surface of the multilayer wiring ceramic package 300 by a seal material 740 so as to seal the accommodating space SP1.

As shown in FIGS. 12B and 12C, the low-thermal-conductivity layer 907 is interposed between the image sensor chip 100 and the signal processing chip 200.

The low-thermal-conductivity layer 907 has thermal conductivity lower than a thermal conductivity of the ceramic substrate constituting the multilayer wiring ceramic package 300, and insulates heat which may be transmitted from the heat-generating signal processing chip 200 to the imaging region PA of the image sensor chip 100.

Inside the accommodating space SP1, a portion between the entire surface of the imaging region PA of the image sensor chip 100 and the entire upper surface of the signal processing chip 200 is provided as the low-thermal-conductivity layer 907.

[B] Conclusion

As described above, in this embodiment, similarly to other embodiments, the low-thermal-conductivity layer 907 is provided so as to be interposed between the imaging region PA of the image sensor chip 100 and the signal processing chip 200, which are arranged to face each other.

For this reason, the low-thermal-conductivity layer 907 insulates heat which may be transmitted from the heat-generating signal processing chip 200 to the imaging region PA of the image sensor chip 100.

In addition, it is possible to release heat of the peripheral region SA of the image sensor chip 100 to the multilayer wiring ceramic package 300.

Therefore, in this embodiment, even when the device is reduced in size, it is possible to suppress the occurrence of dark current in the image sensor chip 100, improving the image quality of captured images.

<8. Embodiment 8>

[A] Device Configuration and the Like

FIGS. 13A to 13C are diagrams showing the configuration of a solid-state imaging device according to Embodiment 8.

Similarly to FIGS. 12A to 12C, FIGS. 13A to 13C schematically show the configuration of the solid-state imaging device. FIG. 13A shows an upper surface of the solid-state imaging device in plan view. FIG. 13B shows a cross-section taken along the line X1-X2 of FIG. 13A. FIG. 13C shows a cross-section taken along the line Y1-Y2 of FIG. 13A.

As shown in FIGS. 13A to 13C, this embodiment is different from Embodiment 1 in that an intermediate plate 301 is further provided. This embodiment is the same as Embodiment 1, excluding this point and related points. For this reason, description of the overlapping portions will be omitted.

As shown in FIGS. 13B and 13C, the intermediate plate 301 is provided between the image sensor chip 100 and the signal processing chip 200.

As shown in FIGS. 13B and 13C, a trench is provided as an accommodating space SP1 in the upper surface of the multilayer wiring ceramic package 300, and the intermediate plate 301 is accommodated inside the accommodating space SP1.

Specifically, as shown in FIGS. 13B and 13C, as in Embodiment 7, the signal processing chip 200 is mounted by die bond material 720 on the bottom surface S14 in the accommodating space SP1. Surface S14 may serve as a die attachment surface. A step is provided in the accommodating space SP1, and the wires 820 are provided between the upper surface S13 of the step and the surface of the signal processing chip 200 to electrically connect the upper surface S13 of the step and the surface of the signal processing chip 200.

However, as shown in FIGS. 13B and 13C, unlike Embodiment 7, in the accommodating space SP1, the intermediate plate 301 is provided on the upper surface S12 of a step higher than the step, on which the wires 820 are provided. That is, the intermediate plate 301 is provided on the second step of the accommodating space SP1. The intermediate plate 301 is bonded to the second step of the accommodating space SP1 by the die bond material 711 in the peripheral portion.

As shown in FIGS. 13B and 13C, the image sensor chip 100 is mounted by means of the die bond material 710 on the upper surface of the intermediate plate 301 as a die attachment surface. As shown in FIG. 13C, the wires 810 are provided between the upper surface S11 of the higher step and the surface of the image sensor chip 100 to electrically connect the upper surface S11 of the step and the surface of the image sensor chip 100. For example, the inner leads (not shown) of the multilayer wiring ceramic package 300 and the image sensor chip 100 are electrically bonded to each other through the Au wires 810. That is, in the third step of the accommodating space SP1, the inner leads (not shown) and the image sensor chip 100 are electrically connected to each other.

In such a manner, the intermediate plate 301 is configured such that the lower surface thereof is bonded to the multilayer wiring ceramic package 300 and the image sensor chip 100 is bonded the upper surface thereof.

As shown in FIGS. 13B and 13C, as in Embodiment 7, a low-thermal-conductivity layer 908 is interposed between the image sensor chip 100 and the signal processing chip 200.

The low-thermal-conductivity layer 908 has thermal conductivity lower than the ceramic substrate constituting the multilayer wiring ceramic package 300, and insulates heat which may be transmitted from the heat-generating signal processing chip 200 to the imaging region PA of the image sensor chip 100. A portion between the entire surface of the imaging region PA of the image sensor chip 100 and the entire upper surface of the signal processing chip 200 is provided as the low-thermal-conductivity layer 908.

However, in this embodiment, unlike Embodiment 7, the low-thermal-conductivity layer 908 is provided so as to be sandwiched between the intermediate plate 301 and the signal processing chip 200 inside the accommodating space SP1.

The intermediate plate may include any suitable material. In this embodiment, for example, the intermediate plate 301, may include the same substrate material as the ceramic substrate constituting the multilayer wiring ceramic package 300 may be used.

Additionally and/or alternatively, as another example, the intermediate plate 301 may include a substrate having thermal conductivity lower than a thermal conductivity of the ceramic substrate constituting the multilayer wiring ceramic package 300 may also be used. In this case, the intermediate plate 301 insulates heat which may be transmitted from the heat-generating signal processing chip 200 to the imaging region PA of the image sensor chip 100. Therefore, heat of the signal processing chip 200 is not easily transmitted to the imaging region PA of the image sensor chip 100, suitably suppressing the occurrence of dark current.

Additionally and/or alternatively, the intermediate plate 301 may include a substrate having thermal conductivity higher than a thermal conductivity of the ceramic substrate constituting the multilayer wiring ceramic package 300 may.

In this case, heat is easily transmitted in the intermediate plate 301, such that it is possible to suitably release the transmitted heat to the multilayer wiring ceramic package 300. Therefore, it is possible to suitably suppress the occurrence of dark current.

[B] Conclusion

As described above, in this embodiment, similarly to other embodiments, the low-thermal-conductivity layer 908 is provided so as to be interposed between the imaging region PA of the image sensor chip 100 and the signal processing chip 200, which are arranged to face each other.

For this reason, the low-thermal-conductivity layer 908 insulates heat which is transmitted from the heat-generating signal processing chip 200 to the imaging region PA of the image sensor chip 100.

It is also possible to insulate or release heat by appropriately adjusting the thermal conductivity of the intermediate plate 301.

In addition, it is possible to release heat of the peripheral region SA of the image sensor chip 100 to the multilayer wiring ceramic package 300.

Therefore, in this embodiment, even when the device is reduced in size, it is possible to suppress the occurrence of dark current in the image sensor chip 100, improving the image quality of captured images.

<9. Embodiment 9>

[A] Device Configuration and the Like

FIGS. 14A to 14C and 15A to 15C are diagrams showing the configuration of a solid-state imaging device according to Embodiment 9.

Similarly to FIGS. 12A to 12C, FIGS. 14A to 14C and 15A to 15C schematically show the configuration of the solid-state imaging device. FIGS. 14A and 15A show an upper surface of the solid-state imaging device. FIG. 14B shows a cross-section taken along the line X1*a*-X2*a* of FIG. 14A. FIG. 14C shows a cross-section taken along the line Y1*a*-Y2*a* of FIG. 14A. FIG. 15B shows a cross-section taken along the line X1-X2 of FIG. 15A. FIG. 15C shows a cross-section taken along the line Y1-Y2 of FIG. 15A.

As shown in FIGS. 14A to 14C and 15A to 15C, in this embodiment, the structure of an accommodating space SP1 of the multilayer wiring ceramic package 300 is different from Embodiment 7. This embodiment is the same as Embodiment 7, excluding this point and related points. For this reason, description of overlapping portions will be omitted.

As shown in FIGS. 14A to 14C, and 15A to 15C, similarly to Embodiment 7, an accommodating space SP1 which is depressed in a concave shape is provided in the upper surface of the multilayer wiring ceramic package 300. The accommodating space SP1 of the multilayer wiring ceramic package 300 is structured so as to be widened upward from the bottom surface in a stepwise manner. Both the image sensor chip 100 and the signal processing chip 200 are accommodated inside the accommodating space SP1.

Specifically, as shown in FIGS. 14A to 14C and 15A to 15C, similarly to Embodiment 7, the signal processing chip 200 is mounted with the die bond material 720 on the bottom surface S14 in the accommodating space SP1. Surface S14 may serve as a die attachment surface. That is, the signal processing chip 200 is mounted on the zero-th step (e.g., bottom surface) of the accommodating space SP1. A step is provided in the accommodating space SP1, and wires 820 are provided between the upper surface S13 of the step and the surface of the signal processing chip 200 to electrically connect the upper surface S13 of the step and the surface of the signal processing chip 200. That is, in the first step of the accommodating space SP1, the inner leads (not shown) and the signal processing chip 200 are electrically connected to each other.

As shown in FIGS. 14A to 14C, and 15A to 15C, similarly to Embodiment 7, the image sensor chip 100 is mounted by means of the die bond material 710 onto the upper surface S12 of the step higher than the step, on which the wires 820 are provided, in the accommodating space SP1 as a die attachment surface. That is, the image sensor chip 100 is mounted on the second step of the accommodating space SP1. The image sensor chip 100 is bonded to the second step of the accommodating space SP1 in the peripheral region SA.

However, as shown in FIGS. 14A to 14C and 15A to 15C, unlike Embodiment 7, the second step of the accommodating space SP1 is formed such that the image sensor chip 100 is placed only with the four corner portions of the image sensor chip 100 having a rectangular shape.

As shown in FIG. 15C, as in Embodiment 7, wires 810 are provided between the upper surface S11 of the step higher than the step as a die attachment surface and the surface of the image sensor chip 100 to electrically connect the upper surface S11 of the step and the surface of the image sensor chip 100. That is, in the third step of the accommodating space SP1, the inner leads (not shown) and the image sensor chip 100 are electrically connected to each other.

In this way, even when the size of the image sensor chip 100 in the vertical direction y is equal to or smaller than the width facing the inner leads of the signal processing chip 200, it is possible to suitably mount the image sensor chip 100.

As shown in FIGS. 14A to 14C and 15A to 15C, a low-thermal-conductivity layer 909 is interposed between the image sensor chip 100 and the signal processing chip 200.

The low-thermal-conductivity layer 909 has thermal conductivity lower than a thermal conductivity of the ceramic substrate constituting the multilayer wiring ceramic package 300, and insulates heat which may be transmitted from the heat-generating signal processing chip 200 to the imaging region PA of the image sensor chip 100.

Similarly to Embodiment 7, inside the accommodating space SP1, a portion between the entire surface of the imaging region PA of the image sensor chip 100 and the entire upper surface of the signal processing chip 200 is provided as the low-thermal-conductivity layer 909.

Unlike Embodiment 7, in the peripheral region SA of the image sensor chip 100, the low-thermal-conductivity layer 909 is provided below a portion other than the four corner portions.

As described above, in this embodiment, the image sensor chip 100 is configured such that only the corner portions thereof are bonded to the multilayer wiring ceramic package 300, and in the peripheral region SA, the low-thermal-conductivity layer 909 is provided in a portion other than the corner portions.

[B] Conclusion

As described above, in this embodiment, similarly to other embodiments, the low-thermal-conductivity layer 909 is provided so as to be interposed between the imaging region PA of the image sensor chip 100 and the signal processing chip 200, which are arranged to face each other.

For this reason, the low-thermal-conductivity layer 909 insulates heat which may be transmitted from the heat-generating signal processing chip 200 to the imaging region PA of the image sensor chip 100.

In addition, it is possible to release heat of the peripheral region SA of the image sensor chip 100 to the multilayer wiring ceramic package 300.

Therefore, in this embodiment, even when the device is reduced in size, it is possible to suppress the occurrence of dark current in the image sensor chip 100, improving the image quality of captured images.

<10. Embodiment 10>
[A] Device Configuration and the Like

FIGS. 16A to 16C and 17A to 17C are diagrams showing the configuration of a solid-state imaging device according to Embodiment 10.

Similarly to FIGS. 14A to 14C and 15A to 15C, FIGS. 16A to 16C and 17A to 17C schematically show the configuration of the solid-state imaging device. FIGS. 16A and 17A show an upper surface of the solid-state imaging device in plan view. FIG. 16B shows a cross-section taken along the line X1a-X2a of FIG. 16A. FIG. 16C shows a cross-section taken along the line Y1a-Y2a of FIG. 16A. FIG. 17B shows a cross-section taken along the line X1-X2 of FIG. 17A. FIG. 17C shows a cross-section taken along the line Y1-Y2 of FIG. 17A.

As shown in FIGS. 16A to 16C and 17A to 17C, this embodiment is different from Embodiment 9 in that a plurality of low-thermal-conductivity layers 910*a* and 910*b* are provided. This embodiment is the same as Embodiment 7, excluding this point and related points. For this reason, description of overlapping portions will be omitted.

As shown in FIGS. 16A to 16C, 17B, and 17C, similarly to Embodiment 9, the second step of the accommodating space SP1 is formed such that the image sensor chip 100 is placed only with the four corner portions of the image sensor chip 100 having a rectangular shape.

Unlike Embodiment 9, inside the accommodating space SP1, the solid low-thermal-conductivity layer 910*a* is provided in a portion between the entire surface of the imaging region PA of the image sensor chip 100 and the entire upper surface of the signal processing chip 200. The low-thermal-conductivity layer 910*a* is arranged, for example, as a plastic spacer.

Similarly to Embodiment 9, in the peripheral region SA of the image sensor chip 100, the low-thermal-conductivity layer 910*b* which is an air layer as gas is provided below a portion other than the four corner portions.

The low-thermal-conductivity layers 910*a* and 910*b* have thermal conductivity lower than a thermal conductivity of the ceramic substrate constituting the multilayer wiring ceramic package 300, and insulate heat which is transmitted from the heat-generating signal processing chip 200 to the imaging region PA of the image sensor chip 100.

[B] Conclusion

As described above, in this embodiment, similarly to other embodiments, the low-thermal-conductivity layers 910*a* and 910*b* are provided so as to be interposed between the imaging region PA of the image sensor chip 100 and the signal processing chip 200, which are arranged to face each other.

For this reason, the low-thermal-conductivity layers 910*a* and 910*b* insulate heat which may be transmitted from the heat-generating signal processing chip 200 to the imaging region PA of the image sensor chip 100.

In addition, it is possible to release heat of the peripheral region SA of the image sensor chip 100 to the multilayer wiring ceramic package 300.

Therefore, in this embodiment, even when the device is reduced in size, it is possible to suppress the occurrence of dark current in the image sensor chip 100, improving the image quality of captured images.

<11. Embodiment 11>
[A] Device Configuration and the Like

FIG. 18 is a diagram showing the configuration of a solid-state imaging device according to Embodiment 11.

FIG. 18 schematically shows the cross-section of the solid-state imaging device. FIG. 18 shows a cross-section corresponding to Y1-Y2 direction of a solid-state imaging device (e.g., FIG. 7C).

As shown in FIG. 18, in this embodiment, the mounting form of the image sensor chip 100 and the structure of an accommodating space SP1 of the multilayer wiring ceramic package 300 are different from Embodiment 7. This embodiment is the same as Embodiment 7, excluding this point and related points. For this reason, description of overlapping portions will be omitted.

As shown in FIG. 18, the image sensor chip 100 and the signal processing chip 200 are provided in the upper surface of the multilayer wiring ceramic package 300.

The accommodating space SP1 which is depressed in a concave shape is provided in the upper surface of the multilayer wiring ceramic package 300. The accommodating space SP1 of the multilayer wiring ceramic package 300 is structured so as to be widened upward from the bottom surface in a stepwise manner. Both the image sensor chip 100 and the signal processing chip 200 are accommodated inside the accommodating space SP1.

Specifically, as shown in FIG. 18, as in Embodiment 7, the signal processing chip 200 is mounted with the die bond material 720 on the bottom surface S14 in the accommodating space SP1. Surface S14 may serve as a die attachment surface. A step is provided in the accommodating space SP1, and wires 820 are provided between the upper surface S13 of the step and the surface of the signal processing chip 200 to electrically connect the upper surface S13 of the step and the surface of the signal processing chip 200. Thus, the inner leads (not shown) of the multilayer wiring ceramic package 300 and the signal processing chip 200 are electrically connected to each other. That is, the signal processing chip 200 is mounted on the zero-th step (bottom surface) of the accommodating space SP1, and in the first step of the accommodating space SP1, the signal processing chip 200 and the multilayer wiring ceramic package 300 are electrically connected to each other.

As shown in FIG. 18, unlike Embodiment 7, in the accommodating space SP1, the image sensor chip 100 is directly mounted on the upper surface of the signal processing chip 200. For example, bumps 810B are provided on the lower surface of the image sensor chip 100, and the image sensor chip 100 and the signal processing chip 200 are electrically connected to each other through the bumps 810B.

In such a manner, the image sensor chip 100 is mounted on the upper surface of the signal processing chip 200 in a bare-chip manner.

As shown in FIG. 18, the transparent glass plate 400 is bonded to the upper surface of the multilayer wiring ceramic package 300 by the seal material 740 so as to seal the accommodating space SP1.

As shown in FIG. 18, a low-thermal-conductivity layer 911 is interposed between the imaging region PA of the image sensor chip 100 and the signal processing chip 200. That is, the low-thermal-conductivity layer 911 is provided in the lower surface opposite to the upper surface, to which incident light is input, in the imaging region PA of the image sensor chip 100.

The low-thermal-conductivity layer 911 has thermal conductivity lower than a thermal conductivity of the substrate (e.g., corresponding to the semiconductor substrate of FIG. 4)

constituting the image sensor chip 100. The low-thermal-conductivity layer 911 has thermal conductivity lower than the ceramic substrate constituting the multilayer wiring ceramic package 300. The low-thermal-conductivity layer 911 insulates heat which may be transmitted from the heat-generating signal processing chip 200 to the imaging region PA of the image sensor chip 100.

A trench is provided in a portion corresponding to the imaging region PA in the lower surface of the image sensor chip 100 facing the signal processing chip 200, and the trench portion includes air or an air layer, which is provided as the low-thermal-conductivity layer 911.

For example, etching processing may be performed for the lower surface of the semiconductor substrate 11 (e.g., see FIG. 4) constituting the image sensor chip 100 to form the trench portion. Thus, the low-thermal-conductivity layer 911 may be provided in this trench portion.

The bumps 810B are provided in a portion corresponding to the peripheral region SA on the lower surface of the image sensor chip 100, and the image sensor chip 100 and the signal processing chip 200 are electrically connected to each other with that portion.

[B] Conclusion

As described above, in this embodiment, similarly to other embodiments, the low-thermal-conductivity layer 911 is provided so as to be interposed between the imaging region PA of the image sensor chip 100 and the signal processing chip 200, which are arranged to face each other.

For this reason, the low-thermal-conductivity layer 911 insulates heat which is transmitted from the heat-generating signal processing chip 200 to the imaging region PA of the image sensor chip 100.

Therefore, in this embodiment, even when the device is reduced in size, it is possible to suppress the occurrence of dark current in the image sensor chip 100, improving the image quality of captured images.

<12. Embodiment 12>

[A] Device Configuration and the Like

FIG. 19 is a diagram showing the configuration of a solid-state imaging device according to Embodiment 12.

Similarly to FIG. 18, FIG. 19 schematically shows the cross-section of the solid-state imaging device.

As shown in FIG. 19, in this embodiment, the mounting form of the image sensor chip 100 and the structure of an accommodating space SP1 of the multilayer wiring ceramic package 300 are different from Embodiment 11. This embodiment is the same as Embodiment 11, excluding this point and related points. For this reason, description of overlapping portions will be omitted.

As shown in FIG. 19, as in Embodiment 11, the signal processing chip 200 is mounted by means of the die bond material 720 on the bottom surface S14 in the accommodating space SP1 provided in the upper surface of the multilayer wiring ceramic package 300. Surface S14 may serve as a die attachment surface. A step is provided in the accommodating space SP1, and wires 820 are provided between the upper surface S13 of the step and the surface of the signal processing chip 200 to electrically connect the upper surface S13 of the step and the surface of the signal processing chip 200. Thus, the inner leads (not shown) of the multilayer wiring ceramic package 300 and the signal processing chip 200 are electrically connected to each other.

As shown in FIG. 19, as in Embodiment 11, in the accommodating space SP1, the image sensor chip 100 is directly arranged on the upper surface of the signal processing chip 200.

As shown in FIG. 19, unlike Embodiment 11, wires 810 are provided between the upper surface S11 of the higher step and the upper surface of the image sensor chip 100 to electrically connect the upper surface S11 of the higher step and the upper surface of the image sensor chip 100. For example, the inner leads (not shown) of the multilayer wiring ceramic package 300 and the image sensor chip 100 are electrically connected to each other through the Au wires 810. That is, in the accommodating space SP1, the inner leads (not shown) and the image sensor chip 100 are electrically connected to each other.

In such a manner, in this embodiment, the image sensor chip 100 and the signal processing chip 200 are mounted in a bare-chip manner.

As shown in FIG. 19, as in Embodiment 11, a low-thermal-conductivity layer 911 is interposed between the imaging region PA of the image sensor chip 100 and the signal processing chip 200. Heat, which may be transmitted from the heat-generating signal processing chip 200 to the imaging region PA of the image sensor chip 100, is insulated by the low-thermal-conductivity layer 911.

[B] Conclusion

As described above, in this embodiment, similarly to other embodiments, the low-thermal-conductivity layer 911 is provided so as to be interposed between the imaging region PA of the image sensor chip 100 and the signal processing chip 200 arranged to face each other.

For this reason, the low-thermal-conductivity layer 911 insulates heat which is transmitted from the heat-generating signal processing chip 200 to the imaging region PA of the image sensor chip 100.

Therefore, in this embodiment, even when the device is reduced in size, it is possible to suppress the occurrence of dark current in the image sensor chip 100, improving the image quality of captured images.

<13. Embodiment 13>

[A] Device Configuration and the Like

Figure 20:
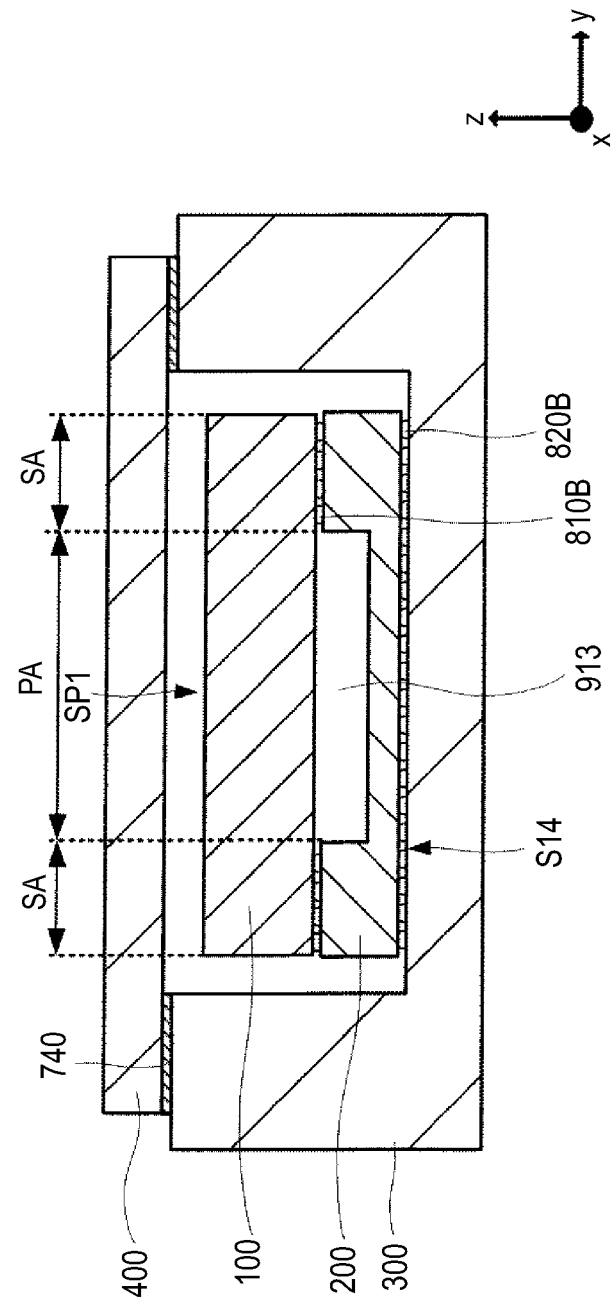
FIG. 20 is a diagram showing the configuration of a solid-state imaging device according to Embodiment 13.

FIG. 20 is a diagram showing the configuration of a solid-state imaging device according to Embodiment 13.

Similarly to FIG. 18, FIG. 20 schematically shows the cross-section of the solid-state imaging device.

As shown in FIG. 20, in this embodiment, the mounting form of the signal processing chip 200, the structure of an accommodating space SP1 of the multilayer wiring ceramic package 300, and the position of a low-thermal-conductivity layer 913 are different from Embodiment 11. This embodiment is the same as Embodiment 11, excluding this point and related points. For this reason, description of overlapping portions will be omitted.

As shown in FIG. 20, the accommodating space SP1 which is depressed in a concave shape is provided in the upper surface of the multilayer wiring ceramic package 300, and both the image sensor chip 100 and the signal processing chip 200 are accommodated inside the accommodating space SP1.

Specifically, as shown in FIG. 20, the signal processing chip 200 is mounted on the bottom surface S14 in the accommodating space SP1.

Unlike Embodiment 11, bumps 820B are provided on the lower surface of the signal processing chip 200. The wiring lines (not shown) of the multilayer wiring ceramic package 300 and the signal processing chip 200 are electrically connected to each other through the bumps 820B.

As shown in FIG. 20, as in Embodiment 11, in the accommodating space SP1, the image sensor chip 100 is directly mounted on the upper surface of the signal processing chip 200. Bumps 810B are provided on the lower surface of the image sensor chip 100, and the image sensor chip 100 and the signal processing chip 200 are electrically connected to each other through the bumps 810B.

As shown in FIG. 20, the low-thermal-conductivity layer 913 is interposed between the imaging region PA of the image sensor chip 100 and the signal processing chip 200.

The low-thermal-conductivity layer 913 has thermal conductivity lower than a substrate (e.g., corresponding to the semiconductor substrate of FIG. 4) constituting the image sensor chip 100. The low-thermal-conductivity layer 913 also has thermal conductivity lower than a thermal conductivity of the substrate constituting the signal processing chip 200. The low-thermal-conductivity layer 913 also has thermal conductivity lower than the ceramic substrate constituting the multilayer wiring ceramic package 300. The low-thermal-conductivity layer 913 insulates heat which may be transmitted from the heat-generating signal processing chip 200 to the imaging region PA of the image sensor chip 100.

A trench is provided in a portion corresponding to the imaging region PA in the upper surface of the signal processing chip 200 facing the image sensor chip 100, and an air layer of the trench portion is provided as the low-thermal-conductivity layer 913.

For example, etching processing is performed for the upper surface of the semiconductor substrate (not shown) constituting the signal processing chip 200 to form the trench portion. Thus, the low-thermal-conductivity layer 913 is provided.

The image sensor chip 100 and the signal processing chip 200 are electrically connected to each other with a portion corresponding to the peripheral region SA of the image sensor chip 100 in the upper surface of the signal processing chip 200.

[B] Conclusion

As described above, in this embodiment, similarly to other embodiments, the low-thermal-conductivity layer 913 is provided so as to be interposed between the imaging region PA of the image sensor chip 100 and the signal processing chip 200, which are arranged to face each other.

For this reason, the low-thermal-conductivity layer 913 insulates heat which is transmitted from the heat-generating signal processing chip 200 to the imaging region PA of the image sensor chip 100.

Therefore, in this embodiment, even when the device is reduced in size, it is possible to suppress the occurrence of dark current in the image sensor chip 100, improving the image quality of captured images.

<14. Embodiment 14>

[A] Device Configuration and the Like

Figure 21:
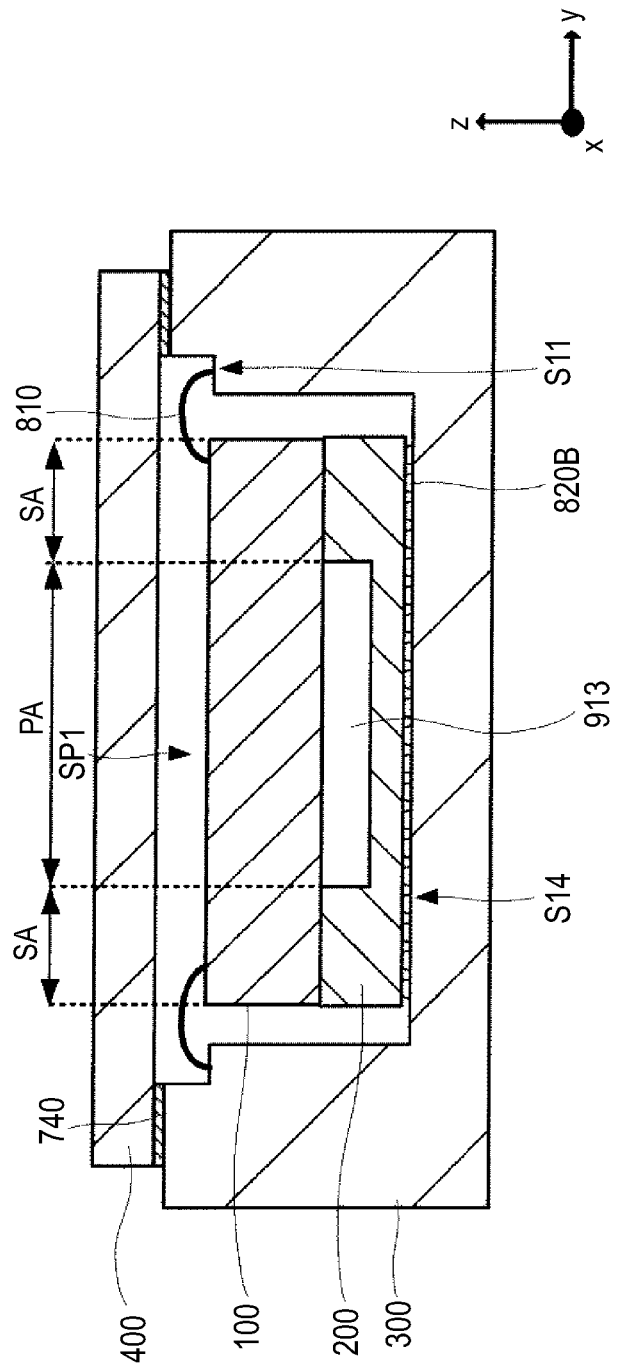
FIG. 21 is a diagram showing the configuration of a solid-state imaging device according to Embodiment 14.

FIG. 21 is a diagram showing the configuration of a solid-state imaging device according to Embodiment 14.

Similarly to FIG. 19, FIG. 21 schematically shows the cross-section of the solid-state imaging device.

As shown in FIG. 21, in this embodiment, the mounting form of the signal processing chip 200, the structure of an accommodating space SP1 of the multilayer wiring ceramic package 300, and the position of a low-thermal-conductivity layer 913 are different from Embodiment 12. This embodiment is the same as Embodiment 12, excluding this point and related points. For this reason, description of overlapping portions will be omitted.

As shown in FIG. 21, the accommodating space SP1 which is depressed in a concave shape is provided in the upper surface of the multilayer wiring ceramic package 300, and both the image sensor chip 100 and the signal processing chip 200 are accommodated inside the accommodating space SP1.

Specifically, as shown in FIG. 21, the signal processing chip 200 is mounted on the bottom surface S14 in the accommodating space SP1.

Unlike Embodiment 12, bumps 820B are provided on the lower surface of the signal processing chip 200. The wiring lines (not shown) of the multilayer wiring ceramic package 300 and the signal processing chip 200 are electrically connected to each other through the bumps 820B.

As shown in FIG. 21, as in Embodiment 12, in the accommodating space SP1, the image sensor chip 100 is directly mounted on the upper surface of the signal processing chip 200.

As shown in FIG. 21, as in Embodiment 12, wires 810 are provided between an upper surface S11 of a higher step and the upper surface of the image sensor chip 100 to electrically connect the upper surface S11 of the step and the upper surface of the image sensor chip 100. For example, the inner leads (not shown) of the multilayer wiring ceramic package 300 and the image sensor chip 100 are electrically connected to each other through the Au wires 810. That is, in the accommodating space SP1, the inner leads (not shown) and the image sensor chip 100 are electrically connected to each other.

As shown in FIG. 21, similarly to Embodiment 13, the low-thermal-conductivity layer 913 is interposed between the imaging region PA of the image sensor chip 100 and the signal processing chip 200.

Specifically, the low-thermal-conductivity layer 913 has thermal conductivity lower than a thermal conductivity of a substrate (e.g., corresponding to the semiconductor substrate of FIG. 4) constituting the image sensor chip 100. The low-thermal-conductivity layer 913 also has thermal conductivity lower than a thermal conductivity of a substrate constituting the signal processing chip 200. The low-thermal-conductivity layer 913 also has thermal conductivity lower than a thermal conductivity of the ceramic substrate constituting the multilayer wiring ceramic package 300. The low-thermal-conductivity layer 913 insulates heat which may be transmitted from the heat-generating signal processing chip 200 to the imaging region PA of the image sensor chip 100.

A trench which is depressed in a concave portion is formed in a portion corresponding to the imaging region PA in the upper surface of the signal processing chip 200, and the trench portion includes air or an air layer, which is provided as the low-thermal-conductivity layer 913.

The image sensor chip 100 is placed on the upper surface of the signal processing chip 200 with the peripheral region SA of the image sensor chip 100.

[B] Conclusion

As described above, in this embodiment, similarly to other embodiments, the low-thermal-conductivity layer 913 is provided so as to be interposed between the imaging region PA of the image sensor chip 100 and the signal processing chip 200 arranged to face each other.

For this reason, the low-thermal-conductivity layer 913 insulates heat which may be transmitted from the heat-generating signal processing chip 200 to the imaging region PA of the image sensor chip 100.

Therefore, in this embodiment, even when the device is reduced in size, it is possible to suppress the occurrence of dark current in the image sensor chip 100, improving the image quality of captured images.

<15. Embodiment 15>

[A] Device Configuration and the Like

Figure 22:
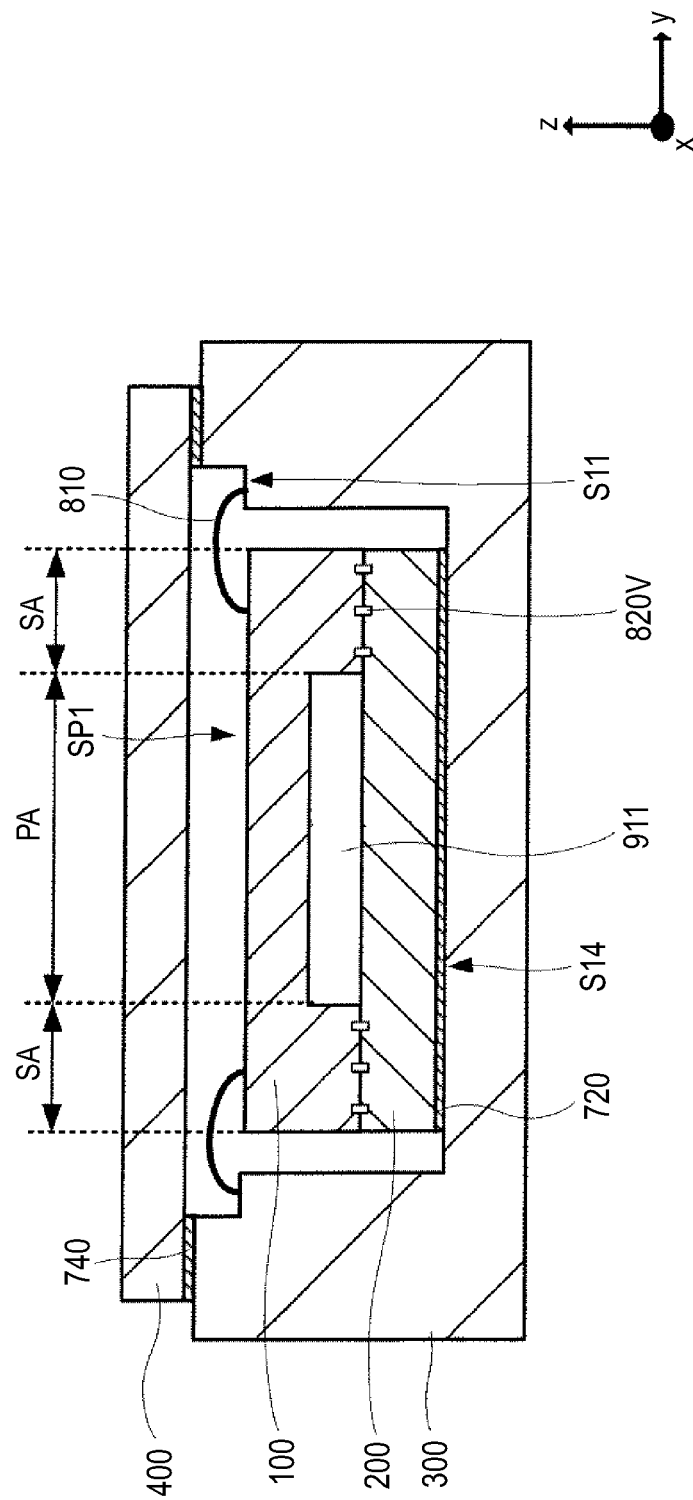
FIG. 22 is a diagram showing the configuration of a solid-state imaging device according to Embodiment 15.
Figure 24A:
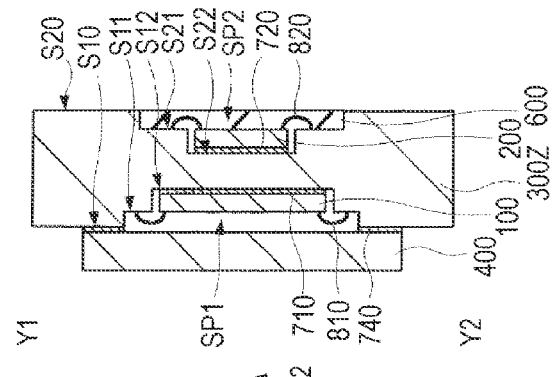
FIGS. 24A to 24C are diagrams schematically showing a solid-state imaging device.
Figure 24B:
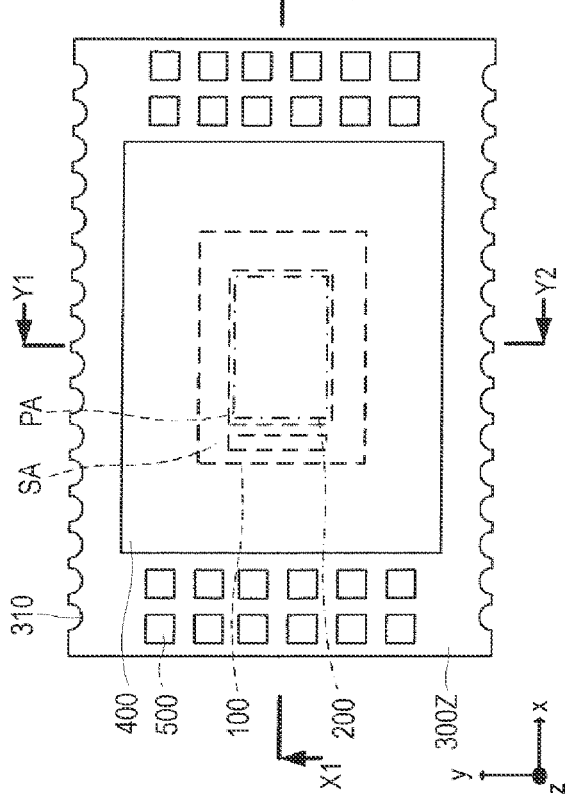
Figure 24C:
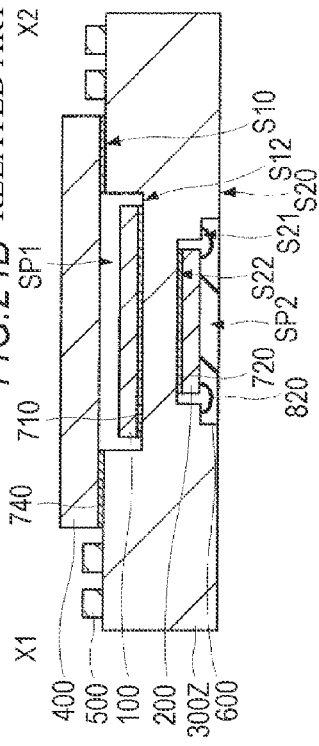

FIG. 22 is a diagram showing the configuration of a solid-state imaging device according to Embodiment 15.

Similarly to FIG. 19, FIG. 22 schematically shows the cross-section of the solid-state imaging device.

As shown in FIG. 22, in this embodiment, the mounting form of the image sensor chip 100 and the signal processing chip 200 and the structure of an accommodating space SP1 of the multilayer wiring ceramic package 300 are different from Embodiment 12. This embodiment is the same as Embodiment 12, excluding this point and related points. For this reason, description of overlapping portions will be omitted.

As shown in FIG. 22, the accommodating space SP1 which is depressed in a concave shape is provided in the upper surface of the multilayer wiring ceramic package 300, and both the image sensor chip 100 and the signal processing chip 200 are accommodated inside the accommodating space SP1.

Specifically, as shown in FIG. 22, as in Embodiment 12, the signal processing chip 200 is mounted on the bottom surface S14 in the accommodating space SP1. The signal processing chip 200 is mounted with the die bond material 720 on the bottom surface S14 in the accommodating space SP1 provided in the upper surface of the multilayer wiring ceramic package 300. Surface S14 may serve as a die attachment surface.

As shown in FIG. 22, as in Embodiment 12, in the accommodating space SP1, the image sensor chip 100 is directly mounted on the upper surface of the signal processing chip 200.

As shown in FIG. 22, unlike Embodiment 12, the image sensor chip 100 and the signal processing chip 200 are electrically connected to each other through connections made by via holes 820V.

Wires 810 are provided between the upper surface S11 of a higher step and the upper surface of the image sensor chip 100 to electrically connect the upper surface S11 of the step and the upper surface of the image sensor chip 100. For example, the inner leads (not shown) of the multilayer wiring ceramic package 300 and the image sensor chip 100 are electrically connected to each other through the Au wires 810. That is, in the accommodating space SP1, the inner leads (not shown) and the image sensor chip 100 are electrically connected to each other.

As shown in FIG. 22, similarly to Embodiment 12, a low-thermal-conductivity layer 911 is interposed between the imaging region PA of the image sensor chip 100 and the signal processing chip 200.

[B] Conclusion

As described above, in this embodiment, similarly to other embodiments, the low-thermal-conductivity layer 911 is provided so as to be interposed between the imaging region PA of the image sensor chip 100 and the signal processing chip 200, which are arranged to face each other.

For this reason, the low-thermal-conductivity layer 911 insulates heat which may be transmitted from the heat-generating signal processing chip 200 to the imaging region PA of the image sensor chip 100.

Therefore, in this embodiment, even when the device is reduced in size, it is possible to suppress the occurrence of dark current in the image sensor chip 100, improving the image quality of captured images.

<16. Embodiment 16>
[A] Device Configuration and the Like

FIG. 23 is a diagram showing the configuration of a solid-state imaging device according to Embodiment 16.

Similarly to FIG. 20, FIG. 23 schematically shows a cross-section of the solid-state imaging device.

As shown in FIG. 23, in this embodiment, the mounting form of the image sensor chip 100 is different from Embodiment 13. This embodiment is the same as Embodiment 13, excluding this point and related points. For this reason, description of overlapping portions will be omitted.

As shown in FIG. 23, an accommodating space SP1 which is depressed in a concave shape is provided in the upper surface of the multilayer wiring ceramic package 300, and both the image sensor chip 100 and the signal processing chip 200 are accommodated inside the accommodating space SP1.

Specifically, as shown in FIG. 23, as in Embodiment 13, the signal processing chip 200 is mounted on the bottom surface S14 in the accommodating space SP1. Bumps 820B are provided on the lower surface of the signal processing chip 200, and the wiring lines (not shown) of the multilayer wiring ceramic package 300 and the signal processing chip 200 are electrically connected to each other through the bumps 820B.

As shown in FIG. 23, as in Embodiment 13, in the accommodating space SP1, the image sensor chip 100 is directly mounted on the upper surface of the signal processing chip 200.

As shown in FIG. 23, unlike Embodiment 13, the image sensor chip 100 and the signal processing chip 200 are electrically connected to each other through connections made by via holes 820V.

As shown in FIG. 22, similarly to Embodiment 13, a low-thermal-conductivity layer 913 is interposed between the imaging region PA of the image sensor chip 100 and the signal processing chip 200.

[B] Conclusion

As described above, in this embodiment, similarly to other embodiments, the low-thermal-conductivity layer 913 is provided so as to be interposed between the imaging region PA of the image sensor chip 100 and the signal processing chip 200, which are arranged to face each other.

For this reason, the low-thermal-conductivity layer 913 insulates heat which may be transmitted from the heat-generating signal processing chip 200 to the imaging region PA of the image sensor chip 100.

Therefore, in this embodiment, even when the device is reduced in size, it is possible to suppress the occurrence of dark current in the image sensor chip 100, improving the image quality of captured images.

<17. Others>

In carrying out the invention, the invention is not limited to the foregoing embodiments, and various modifications may be used.

Although in the foregoing embodiments, a case has been described where the image sensor chip 100 is a CCD image sensor chip, the invention is not limited thereto. The invention may also be applied to a CMOS image sensor chip.

Although in the foregoing embodiments, a case has been described where the invention is applied to a camera, the invention is not limited thereto. The invention may also be applied to other electronic apparatuses having a solid-state imaging device, such as a scanner and a copy machine.

The relationship between the size of the image sensor chip 100 and the size of the signal processing chip 200 is not limited to the above-described relationship. The image sensor chip 100 and the signal processing chip 200 may be of different sizes or of the same size.

The foregoing embodiments may be appropriately combined with each other.

It should be understood by those skilled in the art that various modifications, combinations, sub-combinations and/or alterations may occur depending on design requirements and other factors insofar as they are within the scope of the appended claims or the equivalents thereof.

Although modifications and changes may be suggested by those skilled in the art, it is the intention of the inventors to embody within the patent warranted hereon all changes and modifications as reasonably and properly come within the scope of their contribution to the art.

What is claimed is:

1. A solid-state imaging device comprising:
a substrate, the substrate having a first surface and a second surface that is opposite the first surface;
an image sensor chip mounted on the first surface of the substrate, the image sensor chip having therein an imaging region and a peripheral circuit region so that both the imaging region and the peripheral circuit region are located on the image sensor chip, the imaging region and the peripheral circuit region of the image sensor chip being arranged along the first surface of the substrate;
a signal processing chip mounted on the second surface of the substrate to process an output from the image sensor chip; and
a low thermal conductivity region separate from the substrate and positioned between the image sensor chip and the signal processing chip,
wherein,
the low thermal conductivity region has a thermal conductivity lower than that of the substrate,
the low thermal conductivity region is positioned with respect to the image sensor chip such that the low thermal conductivity region is disposed under the imaging region of the image sensor chip but does not extend to under the peripheral circuit region of the image sensor chip in a direction parallel to the first surface of the substrate along which the imaging region and the peripheral circuit region of the image sensor chip are arranged, and
respective portions of the substrate are disposed under the peripheral circuit region of the image sensor chip, the respective portions of the substrate being between the image sensor chip and the signal processing chip.

2. The solid-state imaging device of claim 1, wherein the substrate comprises a ceramic material.

3. The solid-state imaging device of claim 1, wherein the low thermal conductivity region comprises air or an organic material.

4. The solid-state imaging device of claim 1, further comprising:
a multilayer ceramic wiring package that includes a first wiring layer, the substrate, and a second wiring layer,
wherein,
the image sensor chip and the signal processing chip are electrically connected to the multilayer ceramic wiring package.

5. The solid-state imaging device of claim 1, wherein incident light is received on a first side of the imaging region, and the low thermal conductivity region is positioned on a second side of the imaging region.

6. The solid-state imaging device of claim 1, wherein:
the low thermal conductivity region is formed on at least one of the first surface of the substrate and the second surface of the substrate, and
the substrate is positioned between the imaging region and the signal processing chip.

7. The solid-state imaging device of claim 1, further comprising:
a trench formed in the substrate,
wherein,
the low thermal conductivity region is within the trench.

8. The solid-state imaging device of claim 1, further comprising:
a through-hole formed in the substrate,
wherein,
the low thermal conductivity region is within the through-hole.

9. The solid-state imaging device of claim 1, wherein the low thermal conductivity region is centered about a center of the imaging region.

10. The solid-state imaging device of claim 1, wherein the low thermal conductivity region is effective to insulate the imaging region from heat generated by the signal processing chip.

11. The solid-state imaging device of claim 1, wherein the low thermal conductivity region includes a plate, the plate being provided between the image sensor chip and the signal processing chip.

12. An electronic apparatus comprising:
(1) a solid-state imaging device including
(a) a substrate, the substrate having a first surface and a second surface that is opposite the first surface,
(b) an image sensor chip mounted on the first surface of the substrate, the image sensor chip having therein an imaging region and a peripheral circuit region so that both the imaging region and the peripheral circuit region are located on the image sensor chip, the imaging region and the peripheral circuit region of the image sensor chip being arranged along the first surface of the substrate,
(c) a signal processing chip mounted on the second surface of the substrate to process an output from the image sensor chip, and
(d) a low thermal conductivity region separate from the substrate and positioned between the image sensor chip and the signal processing chip; and
(2) a control section configured to control the solid-state imaging device,
wherein,
the low thermal conductivity region has a thermal conductivity lower than that of the substrate,
the low thermal conductivity region is positioned with respect to the image sensor chip such that the low thermal conductivity region is disposed under the imaging region of the image sensor chip but does not extend to under the peripheral circuit region of the image sensor chip in a direction parallel to the first surface of the substrate along which the imaging region and the peripheral circuit region of the image sensor chip are arranged, and
respective portions of the substrate are disposed under the peripheral circuit region of the image sensor chip, the respective portions of the substrate being between the image sensor chip and the signal processing chip.

13. The electronic apparatus of claim 12, wherein a portion of the substrate is positioned between at least a portion of the peripheral circuit region and a portion of the signal processing chip.

14. The electronic apparatus of claim 12, wherein the substrate comprises a ceramic material.

15. The electronic apparatus of claim 12, wherein the low thermal conductivity region comprises air or an organic material.

* * * * *